US010135539B2

(12) United States Patent
Moss et al.

(10) Patent No.: US 10,135,539 B2
(45) Date of Patent: Nov. 20, 2018

(54) DEVICES AND TECHNIQUES FOR INTEGRATED OPTICAL DATA COMMUNICATION

(71) Applicant: Massachusetts Institute of Technology, Cambridge, MA (US)

(72) Inventors: Benjamin Roy Moss, Brookline, MA (US); Jason Scott Orcutt, Somerville, MA (US); Vladimir Marko Stojanovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 211 days.

(21) Appl. No.: 14/436,613

(22) PCT Filed: Feb. 15, 2013

(86) PCT No.: PCT/US2013/026375
§ 371 (c)(1),
(2) Date: Apr. 17, 2015

(87) PCT Pub. No.: WO2014/062211
PCT Pub. Date: Apr. 24, 2014

(65) Prior Publication Data
US 2016/0013867 A1   Jan. 14, 2016

Related U.S. Application Data

(60) Provisional application No. 61/715,940, filed on Oct. 19, 2012.

(51) Int. Cl.
*H04B 10/516* (2013.01)
*G02F 1/025* (2006.01)
(Continued)

(52) U.S. Cl.
CPC ......... *H04B 10/516* (2013.01); *G02F 1/0121* (2013.01); *G02F 1/0123* (2013.01);
(Continued)

(58) Field of Classification Search
CPC .............................. G02F 1/025; H04B 10/516
See application file for complete search history.

(56) References Cited

U.S. PATENT DOCUMENTS 4,872,774 A   10/1989   Abeles et al.
7,085,443 B1   8/2006   Gunn et al.
(Continued)

FOREIGN PATENT DOCUMENTS

WO   WO2011/143548   * 11/2011   ............... G02B 6/12
WO   WO 2011/143548 A2   11/2011

OTHER PUBLICATIONS

International Search Report and Written Opinion for Application No. PCT/US2013/026375 dated Jun. 13, 2013.
(Continued)

Primary Examiner — Nathan Cors
(74) Attorney, Agent, or Firm — Wolf, Greenfield & Sacks, P.C.

(57) ABSTRACT

Devices and techniques for integrated optical data communication. A method of encoding symbols in an optical signal may include encoding a first symbol by injecting charge carriers, at a first rate, into a semiconductor device, such as a PIN diode. The method may also include encoding a second symbol by injecting charge carriers, at a second rate, into the semiconductor device. The first rate may exceed the second rate. A modulator driver circuit may include a resistive circuit coupled between supply terminal and drive terminals. The modulator driver circuit may also include a control circuit coupled between a data terminal and the resistive circuit. The control circuit may modulate a resis-
(Continued)

tance of the resistive circuit by selectively coupling one or more of a plurality of portions of the resistive circuit to the drive terminal based on data to be optically encoded. In some embodiments, a modulator driver circuit and an optical modulator may be integrated on the same die or stacked (3D integrated) die and connected with through-oxide or through-silicon vias.

11 Claims, 19 Drawing Sheets

(51) Int. Cl.
     *G02F 1/01*         (2006.01)
     *H01L 21/8234*   (2006.01)
     *H01L 31/105*    (2006.01)
     *H01L 31/18*     (2006.01)

(52) U.S. Cl.
     CPC ...... *G02F 1/025* (2013.01); *H01L 21/823437* (2013.01); *H01L 31/105* (2013.01); *H01L 31/18* (2013.01); *G02F 2203/15* (2013.01)

(56) References Cited

U.S. PATENT DOCUMENTS

| | | | |
|---|---|---|---|
| 8,213,751 | B1 | 7/2012 | Ho et al. |
| 2004/0208454 | A1 | 10/2004 | Montgomery et al. |
| 2009/0245795 | A1 | 10/2009 | Joyner et al. |
| 2009/0263078 | A1* | 10/2009 | Hosomi ............. G02B 6/12004 385/14 |
| 2009/0294814 | A1 | 12/2009 | Assefa et al. |
| 2010/0059822 | A1 | 3/2010 | Pinguet et al. |
| 2010/0098372 | A1 | 4/2010 | Manipatruni et al. |
| 2010/0142878 | A1 | 6/2010 | Park et al. |
| 2010/0310207 | A1* | 12/2010 | Kurtz .................. G01L 9/0079 385/13 |
| 2011/0057091 | A1 | 3/2011 | Hochberg et al. |
| 2011/0089493 | A1* | 4/2011 | Lander ............. H01L 29/66795 257/347 |
| 2011/0170819 | A1 | 7/2011 | Zheng et al. |
| 2012/0149148 | A1* | 6/2012 | Dallesasse ........... H01L 25/167 438/107 |
| 2012/0243828 | A1 | 9/2012 | Suzuki |
| 2012/0294563 | A1 | 11/2012 | Thomson et al. |
| 2013/0051725 | A1* | 2/2013 | Shinoda .............. G02F 1/13471 385/14 |
| 2013/0308893 | A1* | 11/2013 | Zuffada .................. H03F 1/223 385/3 |

OTHER PUBLICATIONS

International Preliminary Report on Patentability for Application No. PCT/US2013/026375 dated Apr. 30, 2015.

Liu, Silicon Photonic Modulator Transmits Data at 30 Gb/s. http://www.photonics.com/ArticlePrint.aspx?AID=29078. Accessed on Sep. 15, 2016. 6pgs.

Manipatruni et al., High Speed Carrier Injection 18 Gb/s Silicon Micro-ring Electro-optic Modulator. In Proceedings of IEEE Lasers and Electro-Optics Society. 2007;537-8.

Orcutt et al., Open Foundry Platform for High-Performance Electronic-Photonic Integration. Optics Express. 2012;20(11):12222-32.

Xu et al., 12.5 Gbit/s Carrier-Injection-Based Silicon Micro-ring Silicon Modulators. Optics Express. 2007; 15(2):430-6.

\* cited by examiner

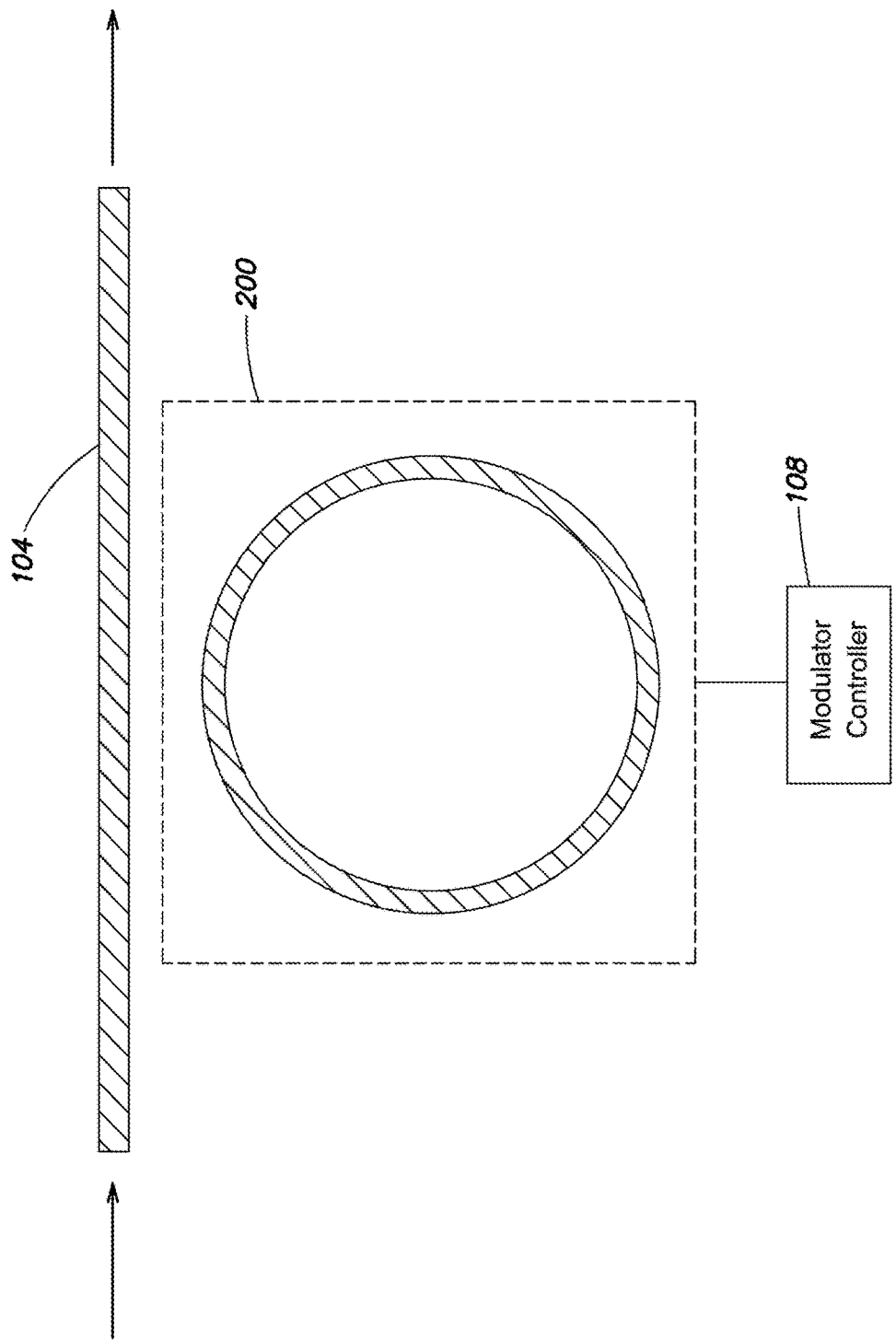

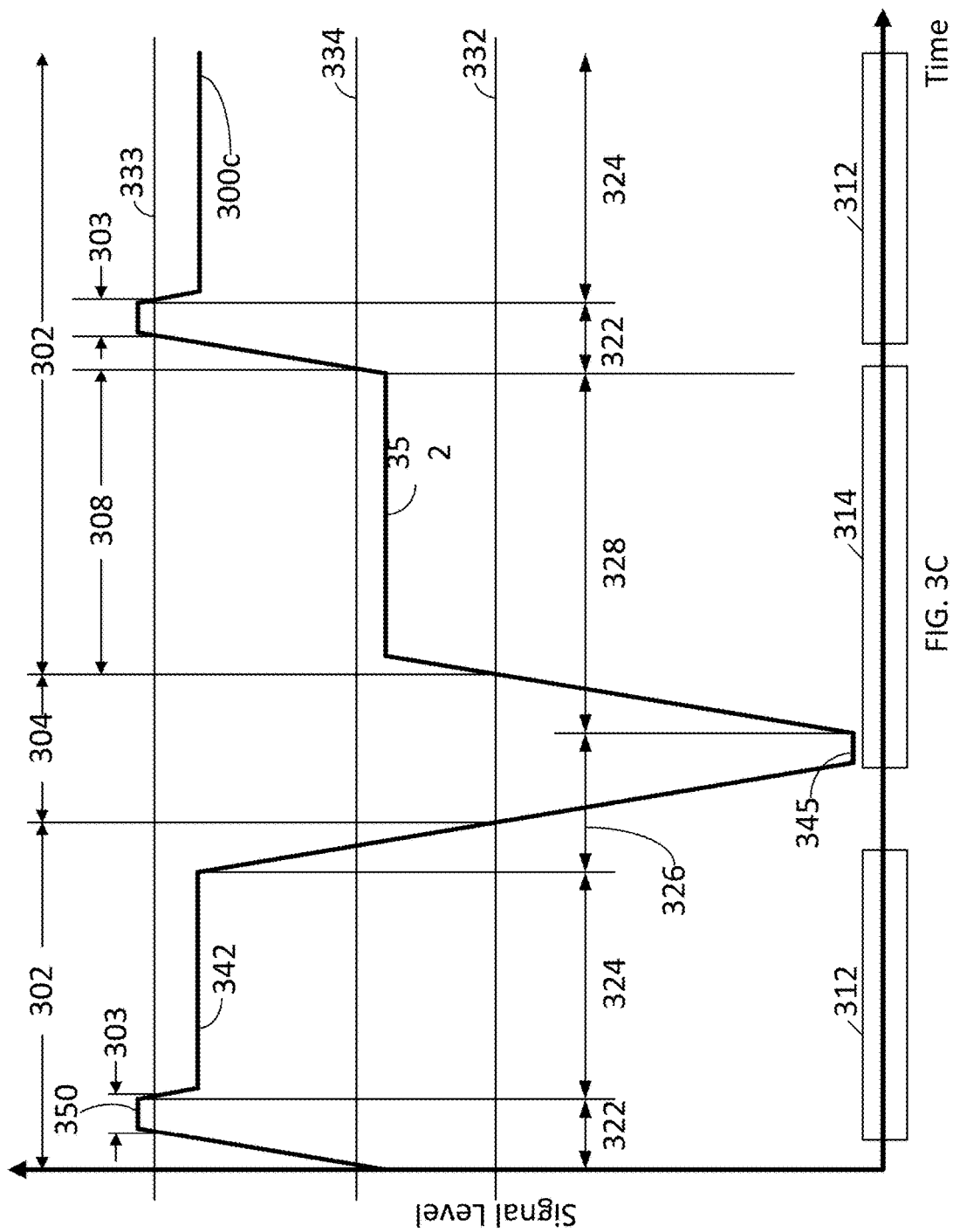

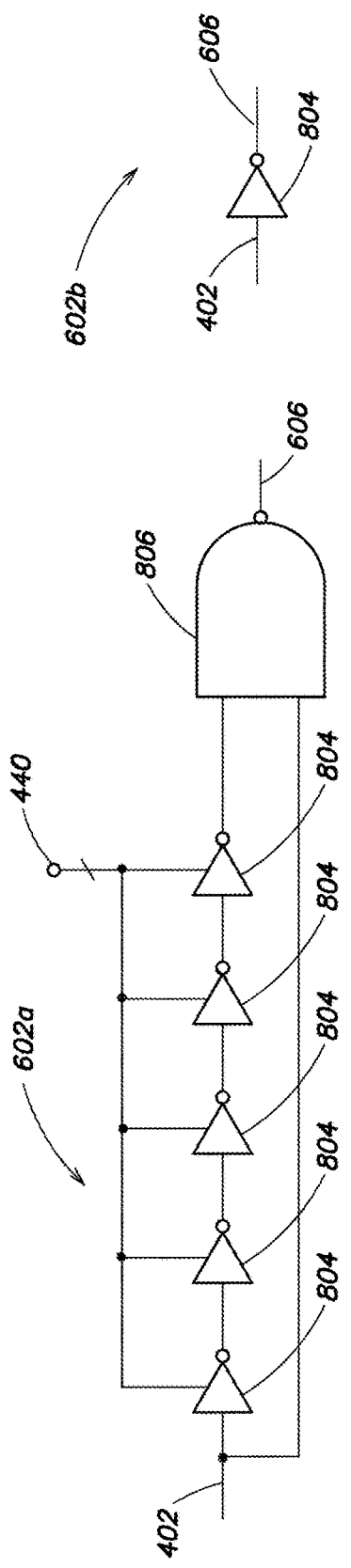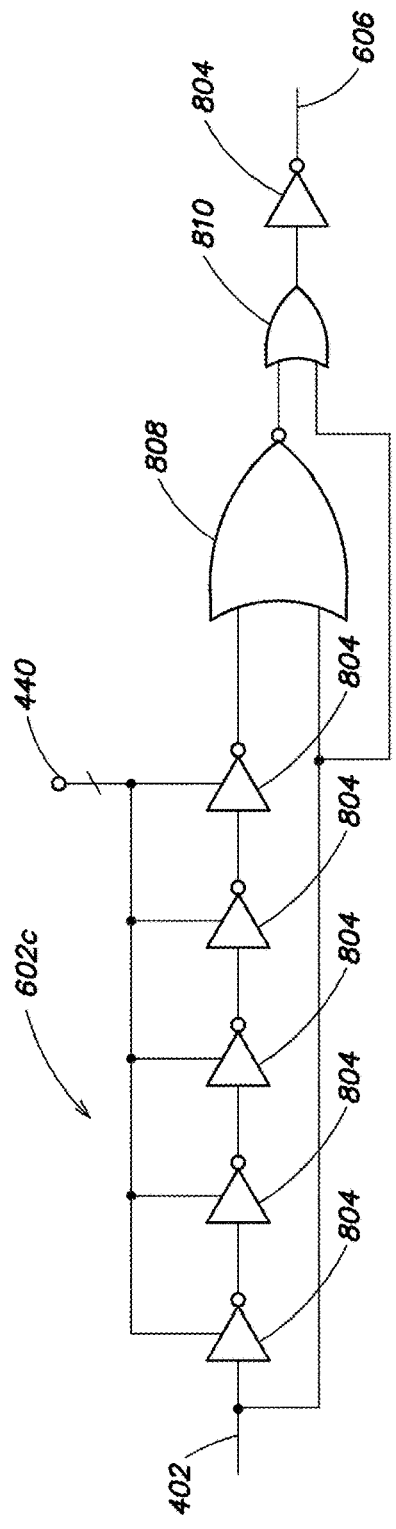
FIG. 8A  FIG. 8B  FIG. 8C

DEVICES AND TECHNIQUES FOR INTEGRATED OPTICAL DATA COMMUNICATION

CROSS-REFERENCE TO RELATED APPLICATIONS

This application is a U.S. National Phase of PCT/US2013/026375, filed Feb. 15 2013, and titled "DEVICES AND TECHNIQUES FOR INTEGRATED OPTICAL DATA COMMUNICATION," which claims the benefit under 35 U.S.C. § 119(e) of U.S. Provisional Patent Application Ser. No. 61/715,940, filed Oct. 19, 2012, and titled, "INTEGRATED SIGNAL-CONDITIONING DRIVER CIRCUIT FOR P-I-N SILICON-PHOTONIC MODULATORS," each of which application are hereby incorporated herein by reference in their entirety.

STATEMENT REGARDING FEDERALLY SPONSORED RESEARCH OR DEVELOPMENT

This invention was made with government support under Grant No. ECCS0844994 awarded by the National Science Foundation and under Contract No. W911NF-10-1-0412 awarded by the Army Research Office. The government has certain rights in this invention.

BACKGROUND

1. Field

The techniques and devices described herein relate generally to integration of optical data communication technology and electronic circuits, and relate particularly to an optical modulator driver circuit which is suitable for use with integrated silicon photonic interconnect technology and is compatible with a standard CMOS process.

2. Discussion of the Related Art

Many electronic devices use one or more integrated circuits to receive, store, process, and/or send data. An integrated circuit ("IC" or "chip") may include a wafer of semiconductor material, such as silicon, on which one or more electronic circuits have been fabricated by applying a sequence of processing steps to the semiconductor wafer. These processing steps may include, for example, photolithographic patterning, material deposition, doping, annealing, material removal, and cleaning. For reasons that are understood by one of ordinary skill in the art (e.g., power dissipation, scalability, and/or cost of manufacturing), many ICs are fabricated using a standard CMOS (complementary metal-oxide semiconductor) manufacturing process, rather than a customized CMOS process or a non-CMOS process.

An electronic device may use data communication technology to move data from one location to another within the device, or to exchange data with another device. A variety of data communication technologies are known, including electrical and optical technologies. Electrical data communication technologies transport data by propagating electrical signals through metal interconnects (e.g., wires). Optical data communication technologies transport data by propagating optical signals (e.g., light) through optical interconnects (e.g., waveguides).

In an optical data communication system, data may be encoded in an optical signal by modulating one or more of the signal's properties, such as its phase, amplitude, frequency, or polarization. Such modulation may be achieved by changing an optical property of the waveguide through which the optical signal propagates, such as the waveguide's absorption coefficient or refractive index. The optical data communication system's performance (e.g., bandwidth-density and power-density) depends on the rate at which data is encoded and the energy dissipated during the encoding of each data symbol (e.g., each bit).

Optical data communication technologies that propagate optical signals through a silicon medium are known as silicon photonic systems. In a silicon photonic system, the plasma dispersion effect may be used to control the concentration of free charge carriers in a semiconductor device, thereby modulating the light carried by a nearby optical waveguide. The concentration of free-carriers may be controlled by carrier injection, carrier depletion, or carrier accumulation techniques. For example, injection-based modulation may be performed using a PIN diode with a silicon waveguide embedded in its intrinsic region. Forward-biasing the PIN diode causes carriers to be injected into the intrinsic region, thereby changing the silicon waveguide's refractive index. As another example, depletion-based modulation may be performed using a PN junction diode with a silicon waveguide embedded in the PN junction region. Reverse-biasing the PN junction causes carriers to be removed from the PN junction region, thereby changing the waveguide's refractive index. As yet another example, accumulation-based modulation may be performed using a device with an insulating layer between P and N regions of a diode (e.g., a MOS capacitor).

Although silicon's refractive index is only weakly dependent on the concentration of free charge carriers, a ring resonator structure for enhancing this dependence has been proposed (Lipson, Nature 2004, p. 1082). Use of such a ring resonator structure may facilitate low-power optical modulation in silicon.

BRIEF SUMMARY

The foregoing summary is provided by way of illustration and is not intended to be limiting.

According to an embodiment of the present disclosure, there is provided a method of encoding a first symbol and a second symbol in an optical signal carried by a waveguide. An optical property of the waveguide depends on a concentration of charge carriers in a portion of a semiconductor device. The method includes encoding the first symbol in the optical signal, wherein encoding the first symbol includes injecting charge carriers, at a first rate, into the portion of the semiconductor device; and encoding the second symbol in the optical signal, wherein encoding the second symbol includes injecting charge carriers, at a second rate, into the portion of the semiconductor device. The first rate is greater than the second rate.

According to another embodiment of the present disclosure, there is provided an integrated circuit for controlling an optical modulator. The optical modulator is configured to encode data in an optical signal carried by an optical waveguide. The optical modulator includes a semiconductor device. An optical property of the waveguide depends on a concentration of charge carriers in a portion of a semiconductor device. The integrated circuit includes a modulator driver circuit configured to control encoding of a first symbol in the optical signal by injecting charge carriers into a portion of the semiconductor device at a first rate, and to control encoding of a second symbol in the optical signal by injecting charge carriers into the portion of the semiconductor device at a second rate. The first rate is greater than the second rate.

According to another embodiment of the present disclosure, there is provided a method of fabricating an integrated circuit in a manufacturing process. The method includes, in a first layer of the manufacturing process, fabricating a body of a transistor of a modulator driver circuit configured to control an optical modulator, the transistor being configured to modulate a resistance between an optical modulator and a supply; in a second layer of the manufacturing process, fabricating a gate of the transistors of the modulator driver circuit; and fabricating an optical waveguide core in the first layer and/or the second layer of the manufacturing process.

According to another embodiment of the present disclosure, there is provided an integrated circuit for controlling an optical modulator. The optical modulator is configured to encode data in an optical signal carried by an optical waveguide. The optical modulator includes a semiconductor device. An optical property of the waveguide depends on a concentration of charge carriers in a portion of a semiconductor device. The integrated circuit includes a modulator driver circuit including a data terminal for receiving data to be optically encoded; a supply terminal for coupling to one or more supplies; a drive terminal for coupling to the optical modulator; a resistive circuit (604) coupled between the supply terminal and the drive terminal, the resistive circuit including a plurality of portions; and a control circuit coupled between the data terminal and the resistive circuit, the control circuit being configured to modulate a resistance of the resistive circuit by selectively coupling one or more of the plurality of portions of the resistive circuit to the drive terminal based on the data to be optically encoded.

BRIEF DESCRIPTION OF THE DRAWINGS

In the drawings, identical or nearly identical components that are illustrated in various figures may be represented by a like reference character. For purposes of clarity, not every component may be labeled in every drawing. The drawings are not necessarily drawn to scale, with emphasis instead being placed on illustrating various aspects of the techniques and devices described herein.

FIG. 2A shows a schematic of a configuration of components including a ring resonator 200, according to some embodiments;

FIG. 3C shows yet another control signal suitable for controlling an optical modulator, according to some embodiments;

FIGS. 8A-8D show schematics of resistance modulation control units, according to some embodiments;

DETAILED DESCRIPTION OF EMBODIMENTS

Figure 1:
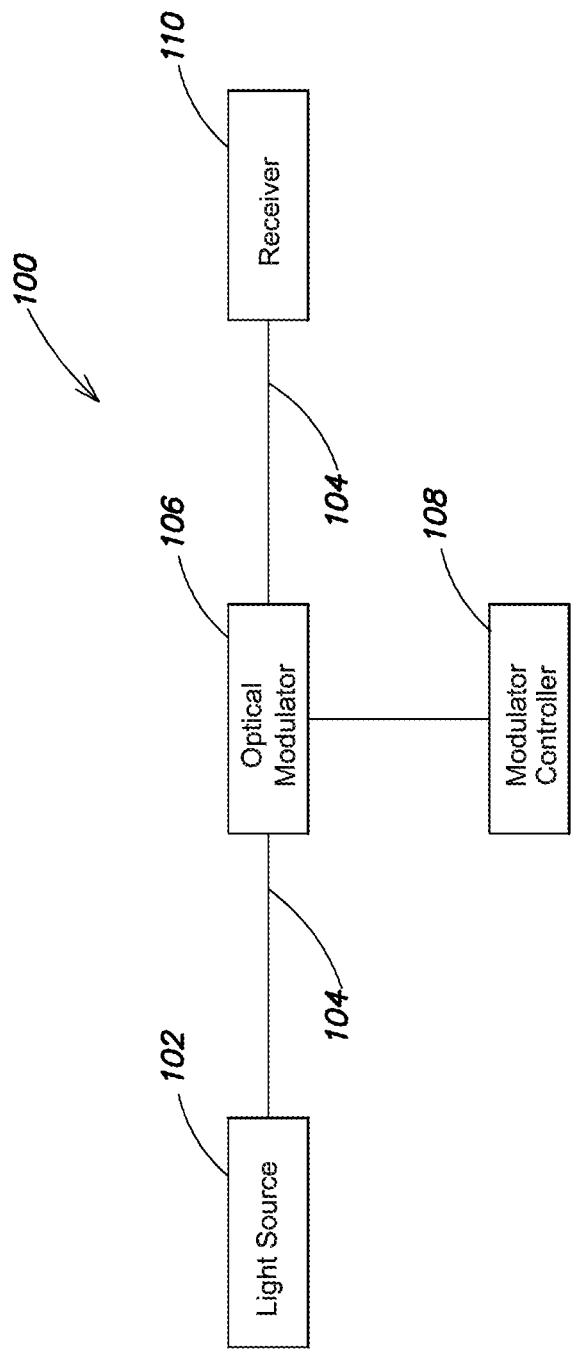
FIG. 1 shows a block diagram of an optical data communication system, according to some embodiments.

The inventors has appreciated a need for an integrated optical data communication technology that is compatible with standard CMOS processes. Techniques are needed for increasing the communication bandwidth and reducing the power dissipation of integrated circuits (ICs). Integrated optical data communication technologies—which may provide higher communication bandwidth and reduced power dissipation than the electrical data communication technologies used by most conventional ICs—have been proposed. However, the commercial viability of an IC structure may depend greatly on whether the structure can be manufactured in a standard CMOS process, and previously proposed techniques for integrating optical data communication technologies into integrated circuits (ICs) require customized processing steps and/or materials that are not used in standard CMOS manufacturing processes. For example, incorporation of optical data communication technologies into ICs through hybrid or heterogeneous process technologies has been proposed. As another example, a customized CMOS process for fabricating ICs with optical data communication technology has been proposed, but the proposed process requires a buried oxide (BOX) layer that is at least an order of magnitude thicker than the BOX layers used in standard CMOS processes. These techniques tend to increase the cost of fabricating the IC, suffer from large packaging parasitics, and/or degrade transistor performance.

Described herein are devices and associated techniques that can be used to provide high-bandwidth, low-power, optical data communication systems on integrated circuits, including integrated circuits fabricated with standard CMOS processes. Operating the disclosed devices in accordance with the disclosed methods may enable an integrated optical data communication system, such as an integrated silicon photonic system, to operate at a high bandwidth (e.g., hundreds of Gb/s, Tb/s, etc.) and with low energy dissipation (e.g., 1.2 pJ/b).

According to an aspect of the present disclosure, a modulator driver circuit may be used to electrically control an optical modulator, such as a silicon photonic modulator that is controlled by the free-carrier concentration in a semiconductor device. In some embodiments, the modulator driver circuit uses resistance modulation to electrically control the drive strength of the optical modulator (e.g., the current through a component of the modulator). In some embodiments, the modulator driver circuit is suitable for fabrication in standard CMOS processes, without requiring process customizations or foundry changes. For example, embodiments of the driver circuits are suitable for fabrication in sub-130 nm standard CMOS processes, such as 22 nm or 45 nm bulk and silicon-on-insulator (SOI) processes.

According to another aspect of the present disclosure, pre-emphasis of the drive strength of an optical modulator may be used to speed up the modulator's switching rate (e.g., the rate at which the modulator switches from optically encoding one symbol to optically encoding another symbol). In some embodiments, an optical modulator's drive strength may control the rate at which free charge carriers are injected into, depleted from, or accumulated in a portion of the optical modulator, and the concentration of free charge carriers may determine whether the light is modulated to encode a 0-bit or a 1-bit. In some embodiments, a low-to-high transition of the modulator's drive strength may be pre-emphasized, thereby accelerating injection of free charge carriers and speeding up the modulator's transition from a first state (e.g., a state in which light is modulated to encode a 0-bit) to a second state (e.g., a state in which light is modulated to encode a 1-bit). In some embodiments, the a high-to-low transition of the modulator's drive strength may be pre-emphasized, thereby accelerating removal of free charge carriers and speeding up the modulator's transition from the second state (e.g., the 1-bit encoding state) to the first state (e.g., the 0-bit encoding state). In some embodiments, pre-emphasis of the modulator's drive strength may be controlled by modulating a resistance of a modulator driver circuit.

According to another aspect of the present disclosure, the optical modulator's mode of operation may be controlled to speed up the modulator's switching rate. For example, in some embodiments, a component of the optical modulator (e.g., a PIN diode) may be forward-biased during the 1-bit encoding state and weakly forward-biased during the 0-bit encoding state. Forward-biasing may refer to biasing the component at a voltage above its threshold voltage, and weakly forward-biasing may refer to biasing the component in the forward direction at a voltage below its threshold voltage. This technique may accelerate the modulator's transitions from a first encoding state to a second encoding state (e.g., from the 0-bit encoding state back to the 1-bit encoding state), by reducing the number of additional free charge carriers that must be injected into the optical modulator to bring about the transition to the second encoding state.

According to another aspect of the present disclosure, a silicon photonic data communication system may be fabricated in a standard CMOS process. In some embodiments, bodies of transistors of a modulator driver circuit and portions of a silicon waveguide may be fabricated in a body-silicon layer at the front end of a CMOS process. In some embodiments, gates of transistors of a modulator driver circuit and portions of a silicon waveguide may be fabricated in a gate-polysilicon layer at the front end of a CMOS process. The transistors of the modulator drive circuit may modulate a resistance between a voltage supply and an optical modulator component, such as a PIN diode.

The aspects described above, as well as additional aspects, are described further below. These aspects may be used individually, all together, or in any combination of two or more, as the technology is not limited in this respect.

Optical Data Communication System

FIG. 1 shows a block diagram of an optical data communication system 100, according to some embodiments. The system includes a light source 102, an optical waveguide 104, an optical modulator 106, a modulator controller 108, and a receiver 110. In some embodiments, one or more components of optical data communication system 100 may be integrated on-chip with one another. The integration may be monolithic or heterogeneous. As just one example, optical waveguide 104, modulator 106, modulator controller 108, and receiver 110 may be monolithically integrated on-chip through a standard CMOS process, and an off-chip light source 102 may be coupled to the other components of optical data communication system 100 through couplers (e.g., vertical grating or edge couplers). However, embodiments are not limited in this respect. Components of data communication system 100 may be implemented and coupled together by any means known of one to ordinary skill in the art or otherwise suitable for implementing and coupling components of an optical data communication system.

Light source 102 provides light (e.g., an optical signal) which propagates through the optical waveguide 104. The light source 102 may be, for example, a laser, a light emitting diode (LED), or any other light source known to one of ordinary skill in the art or otherwise suitable for use in an optical data communication system. In some embodiments, light source 102 may provide light having wavelengths between approximately 1260 nm to 1350 nm, or wavelengths between approximately 1560 nm to 1630 nm. However, embodiments of light source 102 are not limited in this regard. Light source 102 may provide light having any wavelengths suitable for propagation through an optical waveguide 104 (e.g., a silicon waveguide), including (but not limited to) wavelengths between 1100 nm and 1600 nm.

Optical waveguide 104 is a structure which guides the light provided by the light source 102. Optical waveguide 104 may be, for example, a strip waveguide, a rib waveguide, a segmented waveguide, and/or a photonic crystal waveguide. The transmission loss of optical waveguide 104 may be, for example, less than 3 dB/cm, less than 2.5 dB/cm, less than 2.0 dB/cm, less than 1.5 dB/cm, or less than 1.0 dB/cm. In some embodiments, optical waveguide 104 may be formed from silicon, polysilicon, and/or other silicon-based materials. Embodiments of optical waveguide 104 that are formed from silicon may be formed in the body silicon layer of the front-end of a standard CMOS process. Embodiments of optical waveguide 104 that are formed from polysilicon may be formed in the gate-polysilicon layer of the front-end of a standard CMOS process. In embodiments where the optical waveguide is formed from a silicon-based material, the optical data communication system 100 may be a silicon photonic system. In some embodiments, the transmission loss of an optical waveguide (e.g., silicon) may be reduced to an acceptable level (e.g., less than 3 dB/cm) using techniques known to one of ordinary skill in the art, such as partially undercutting the waveguide (i.e., removing some of the silicon surrounding the waveguide so that the portions of the waveguide are suspended) and filling the area around the waveguide with a substance that has low transmission loss, or removing the substrate and covering the waveguide with a material that has low transmission loss.

Embodiments of optical waveguide 104 may propagate a single optical signal at a time, or propagate multiple optical signals of different wavelengths simultaneously. Simultaneous propagation of multiple optical signals of different wavelengths may be carried out in accordance with a wavelength-division multiplexing (WDM) protocol. When multiple optical signals of different wavelengths simultaneously propagate through optical waveguide 104, the communication bandwidth of the optical waveguide may exceed 10 Gb/s, 100 Gb/s, or 1 Tb/s.

Optical modulator 106 encodes data in the light propagating through waveguide 104 by modulating one or more properties of the light, such as the light's phase, amplitude, frequency, or polarization. Some embodiments may modulate the light by changing an optical property of waveguide 104, such as the waveguide's absorption coefficient or refractive index. Embodiments of optical modulator 106 may control changes in the optical properties of waveguide 104 using electro-optic modulation, acousto-optic modulation, magneto-optic modulation, thermo-optic modulation, mechano-optic modulation, or any other modulation technique known to one of ordinary skill in the art or otherwise suitable for controlling a waveguide's optical properties.

In some embodiments, optical modulator 106 may modulate the light carried by waveguide 104 to encode symbols from an N-symbol alphabet, where N is a finite number. Each symbol in the modulator's N-symbol alphabet may correspond to a distinct encoding state of the modulator, such that when the modulator is in a given encoding state, the light is modulated to encode the symbol that corresponds to that encoding state. For example, embodiments of optical modulator 106 may modulate the light to encode a 2-symbol (binary) alphabet by modulating the light to encode a first symbol (e.g., a 1-bit) when the modulator is in a first encoding state, and modulating the light to encode a second symbol (e.g., a 0-bit) when the modulator is in a second encoding state.

Embodiments of optical modulator 106 may include any structure that modulates light passing through optical waveguide 104 in response to the concentration of free carriers in a portion of the optical modulator. For example, embodiments of optical modulator 106 may include a carrier-concentration controller, such as a MOS capacitor, a PIN diode, or a PN junction diode. In some embodiments, the drive strength of the optical modulator (e.g., the level of the current entering or leaving a terminal of the optical modulator, or the level of the current passing through the modulator's carrier-concentration controller) may determine the rate at which free carriers are injected into, depleted from, or accumulated in a portion of the optical modulator, thereby controlling the modulator's operation.

Optical modulator 106 may operate in one or more operating modes. In some embodiments, the modulator's operating modes may correspond to operating modes of a carrier-concentration controller included in the optical modulator. For example, some embodiments of optical modulator 106 may have two operating modes, corresponding to forward-biased or reverse-biased operation of a carrier-concentration controller, such as a PIN diode or a PN junction diode in which a ring resonator is embedded. Some embodiments of optical modulator 106 may have three operating modes, corresponding to forward-biased, weakly forward-biased, or reverse-biased operation of a carrier-concentration controller. Some embodiments of optical modulator 106 may have four operating modes, corresponding to strongly forward-biased, forward-biased, weakly forward-biased, or reverse-biased operation of a carrier-concentration controller. In some embodiments, steady-state operation of the optical modulator in one or more operating modes may correspond to one or more of the modulator's encoding states.

Modulator controller 108 controls the operation of optical modulator 106. In some embodiments, modulator controller 108 may receive data input indicative of data to be encoded in the light propagating through waveguide 104. Based on the data input, modulator controller 108 may provide a control input to modulator 106, thereby causing modulator 106 to modulate the light propagating through waveguide 104 such that the light encodes the data. Modulator controller 108 may provide the control input to modulator 106 in any suitable form, including but not limited to an electrical signal, an acoustic signal, a magnetic signal, or a thermal signal.

In some embodiments, optical modulator 106 may include a ring resonator 200. Some embodiments of ring resonator 200 may be implemented in the body-silicon layer and/or gate (or resistor, or sacrificial) polysilicon layer in the front-end of a standard CMOS process (or thin-BOX SOI CMOS process), or as amorphous, crystalline or poly silicon layers deposited in the back-end of a standard CMOS process (or thin BOX SOI CMOS process). FIG. 2A schematically illustrates a configuration of components including a ring resonator 200, according to some embodiments. In the embodiment of FIG. 2A, modulator controller 108 controls the modulation of light propagating through waveguide 104 by tuning the resonance frequency of ring resonator 200. In the embodiment of FIG. 2A, waveguide 104 is a poor transmitter (e.g., exhibits a low transmission coefficient) for light having a wavelength that matches the resonance wavelength of ring resonator 200, but a good transmitter (e.g., exhibits a high transmission coefficient) for light having other wavelengths. In other words, in the embodiment of FIG. 2A, one or more properties of the light propagating through waveguide 104 depend on whether the light's wavelength matches the resonance wavelength of ring resonator 200. Thus, tuning the resonance wavelength of ring resonator 200 to the wavelength of the light in waveguide 104 and detuning the resonance wavelength of ring resonator 200 from the wavelength of the light in waveguide 104 may modulate the light's properties, thereby encoding data in the light.

Figure 2B:
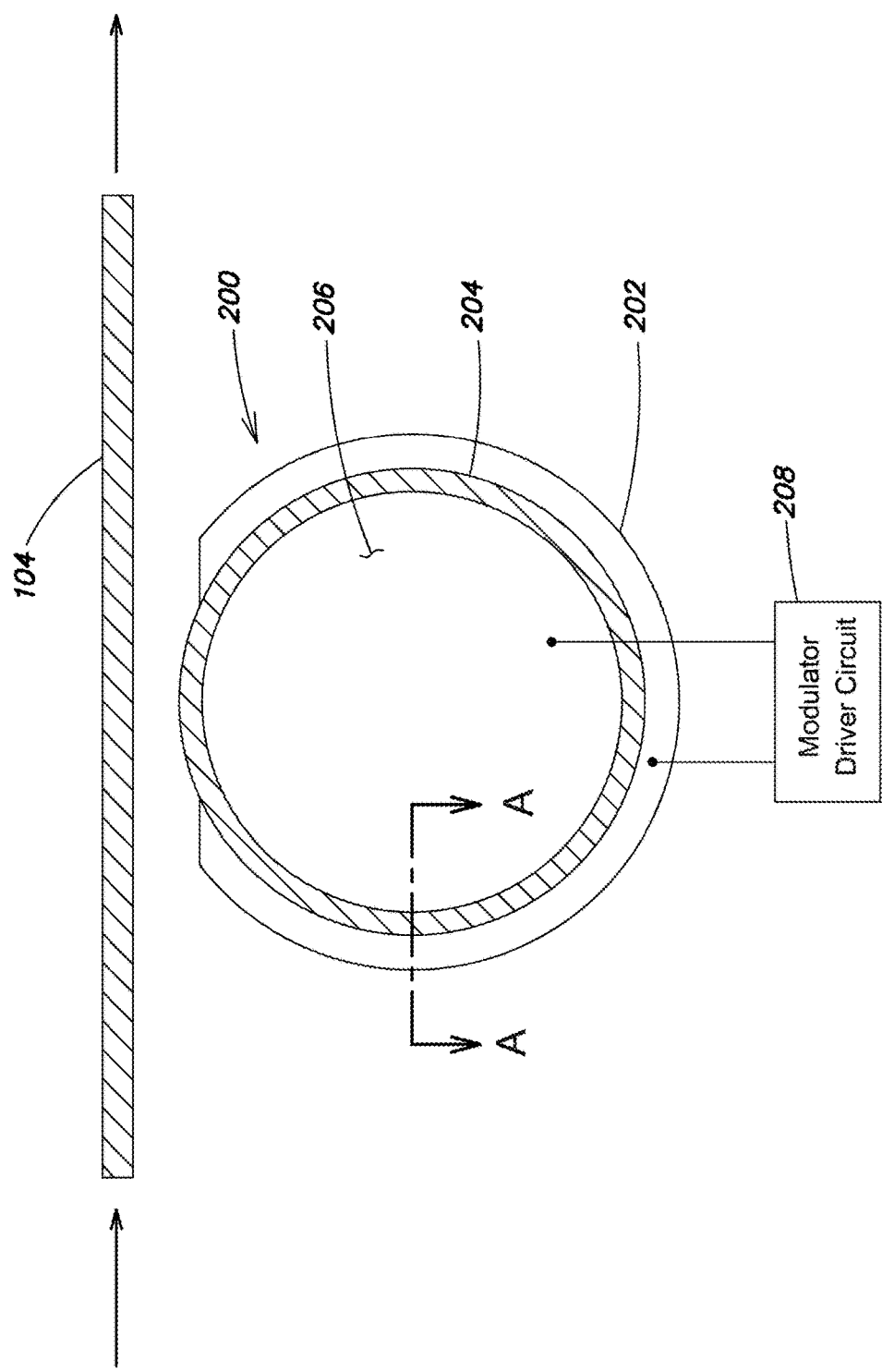
FIG. 2B shows a schematic of a configuration of components including a ring resonator 200 embedded in a diode, according to some embodiments.

In some embodiments, electro-optic effects may be used to tune the resonance wavelength of ring resonator 200. FIG. 2B schematically illustrates a configuration of components which may facilitate electrically-controlled modulation of the light in waveguide 104, according to some embodiments. In the embodiment of FIG. 2B, ring resonator 200 is implemented using a strip-loaded (rib) waveguide 204 that is embedded in a diode (202, 204, 206), such that the resonance wavelength of ring resonator 200 depends on the concentration of free charge carriers in waveguide 204. Embodiments of waveguide 204 may function as carrier-injection phase shifters.

In the embodiment of FIG. 2B, modulator controller 108 is implemented using a modulator driver circuit 208. Some embodiments of modulator driver circuit 208 may control the drive strength applied to the terminals of the diode (202, 204, 206) in which waveguide 204 is embedded. In this manner, embodiments of modulator driver circuit 208 may electrically control the concentration of free charge carriers in a portion of the diode, thereby controlling the resonance wavelength of ring resonator 200, thereby controlling modulation of the light in waveguide 104.

Figure 2C:
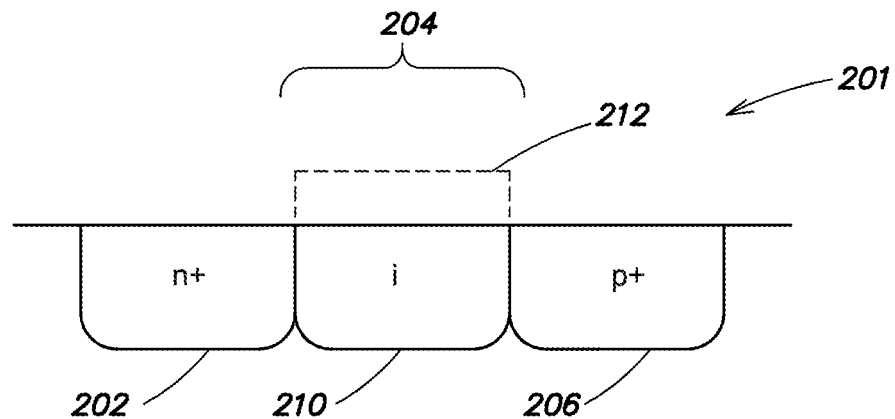
FIG. 2C shows a cross section of a PIN diode along the line A-A, according to some embodiments.

In some embodiments, the diode in which waveguide 204 of ring resonator 200 is embedded may be PIN diode (e.g., an enhancement-mode PIN diode). FIG. 2C, which shows a cross section of a diode along line A-A of FIG. 2B, illustrates an embodiment in which ring resonator 200 is embedded in a PIN diode 201. As shown in FIG. 2C, the PIN diode includes a heavily-doped n-type diffusion region 202, a heavily-doped p-type diffusion region 206, and an intrinsic semiconductor region 210 between the p-type and n-type regions. The PIN diode of FIG. 2B may switch between a forward-biased state and a reverse-biased state at a rate of approximately 200 MHz. In some embodiments, the diffusion regions 202 and 206 and intrinsic semiconductor region 210 may be implemented in the body-silicon layer of the front-end of a standard CMOS process. In some embodiments, intrinsic semiconductor region 210 may be overlain by a polysilicon layer 212, which may be implemented in the gate-polysilicon layer of the front-end of a standard CMOS process. Together, portions of the intrinsic semiconductor region 210 and the optional polysilicon layer 212 may form the waveguide 204 of ring resonator 200. FIG. 2C also illustrates an embodiment of modulator driver circuit 208, which controls the concentration of charge carriers in the ring resonator's waveguide by controlling the drive strength of the PIN diode through terminals coupled to the diode's p-type and n-type regions.

Figure 2D:
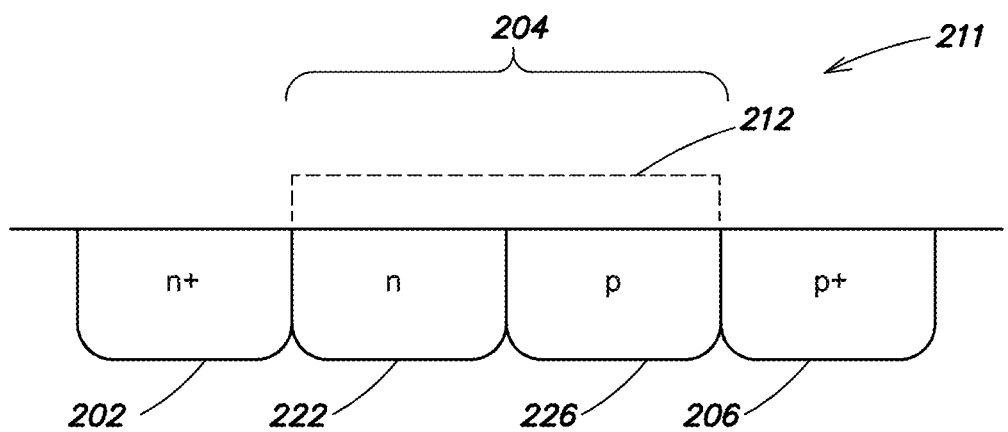
FIG. 2D shows a cross section of a PN junction diode along the line A-A, according to some embodiments.

In some embodiments, the diode in which waveguide 204 of ring resonator 200 is embedded may be a PN junction diode (e.g., a depletion-mode PN diode). FIG. 2D, which shows a cross section of another diode along line A-A of FIG. 2B, illustrates an embodiment in which ring resonator 200 is embedded in a PN junction diode 211. As shown in FIG. 2D, the PN junction diode includes a heavily-doped n-type diffusion region 202, an n-type diffusion region 222, a p-type diffusion region 226, and a heavily-doped p-type diffusion region 206. In some embodiments, the diffusion regions 202, 206, 222, and 226 may be implemented in the body-silicon layer of the front-end of a standard CMOS process. In some embodiments, diffusion regions 222 and 226 may be overlain by a polysilicon layer 212, which may be implemented in the gate-polysilicon layer of the front-end of a standard CMOS process (or in the deposited amorphous, crystalline and/or poly silicon layers in the backend of a CMOS process). Together, portions of the diffusion regions 222 and 226 and optional polysilicon layer 212 may form the waveguide 204 of ring resonator 200. FIG. 2D also illustrates an embodiment of modulator driver circuit 208, which controls the concentration of charge carriers in the ring resonator's waveguide by controlling the drive strength of the PN junction diode through terminals coupled to the diode's heavily-doped diffusion regions.

Returning to FIG. 1, optical data communication system 100 also includes an optical receiver 110. Optical receiver 110 may receive light encoded with data through waveguide 104, and convert the optically-encoded data into electrical signals. Embodiments of optical receiver 110 may include any structure that detects light, including (but not limited to) a photodiode or a photogate.

Controlling an Optical Modulator

Figure 3A:
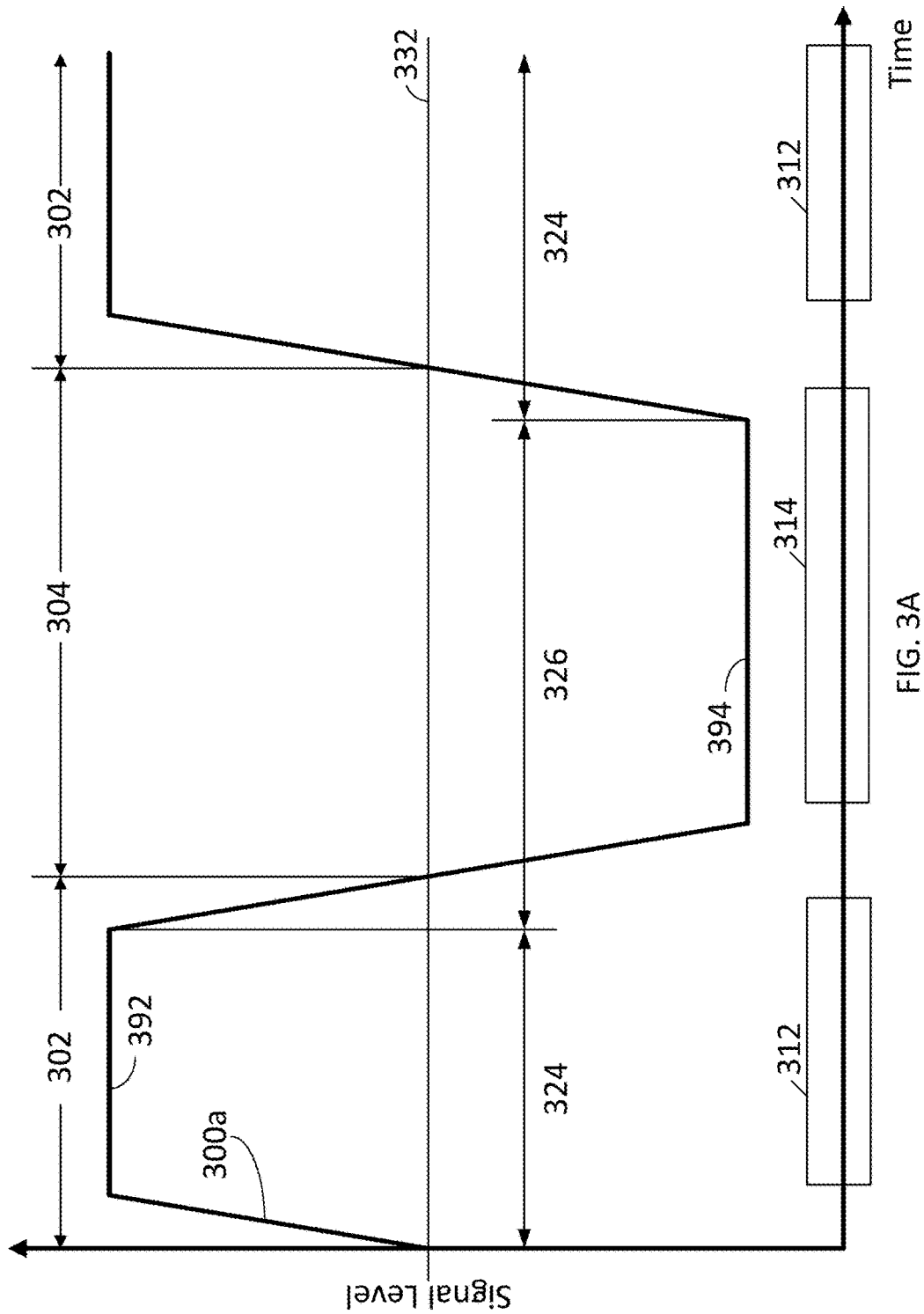
FIG. 3A shows a control signal suitable for controlling an optical modulator, according to some embodiments.

Embodiments of modulator controller 108 may control the operating mode and/or encoding state of optical modulator 106 by controlling the concentration of free carriers in a region of a semiconductor device (e.g., by controlling the rate at which free carriers are injected, discharged, and/or accumulated). In some embodiments, the concentration of free carriers may be controlled by a signal provided in a portion of optical modulator 106. FIG. 3A shows an example 300a of a signal that controls the concentration of free carriers in an optical modulator 106 during optical encoding of data. In the example of FIG. 3A, signal 300a illustrates the drive strength of the optical modulator during a period of operation. However, embodiments are not limited in this regard. The concentration of free carriers may be controlled by any type of electrical signal, such as a current, voltage, or power signal.

In the example of FIG. 3A, modulator controller 108 switches the level of signal 300a between a first signal level 392 and a second signal level 394. When the signal's level is above a threshold level 332, optical modulator 106 operates in a first mode of operation 302. When the control signal's level is below the threshold level 332, optical modulator 106 operates in a second mode of operation 304. While the optical modulator 106 is in the first mode of operation 302, the modulator enters a first encoding state 312, in which the modulator encodes a first symbol in the light carried by waveguide 104. Two or more consecutive instances of the first symbol may be optically encoded while the modulator remains in the first encoding state 312. While the optical modulator 106 is in the second mode of operation 304, the modulator enters a second encoding state 314, in which the modulator encodes a second symbol in the light carried by waveguide 104. Two or more consecutive instances of the second symbol may be optically encoded while the modulator remains in the second encodings state 314.

As described above, signal 300a of FIG. 3A illustrates the drive strength of some embodiments of optical modulator 106, during a period of operation. The optical modulator may include a PIN diode 201 in which a ring resonator 200 is embedded. When the drive strength exceeds a threshold level 332, the PIN diode 201 may operate in a forward-biased mode 302, causing free charge carriers to be injected into the diode's intrinsic region 210 (e.g., at a rate that exceeds the rate of free carrier recombination). When the concentration of free charge carriers in the diode's intrinsic region exceeds a threshold concentration, optical modulator 106 may enter a first encoding state 312, in which ring resonator 200 causes a 1-bit to be encoded in the light carried by waveguide 104. When the drive strength falls below threshold level 332, PIN diode 201 may operate in a reverse-biased mode 304, in which the concentration of charge carriers in the diode's intrinsic region 210 decreases because free carriers are discharged from the intrinsic region or additional free-carriers are not injected into the intrinsic region to compensate for free-carrier recombination. When the concentration of free charge carriers in the diode's intrinsic region falls below a threshold concentration, optical modulator 106 may enter a second encoding state 314, in which ring resonator 200 causes a 0-bit to be encoded in the light carried by waveguide 104.

Embodiments of modulator driver circuit 208 may control the drive strength of the optical modulator 106 according to the techniques illustrated in FIG. 3A. For example, embodiments of modulator driver circuit 208 may adjust the drive strength of the optical modulator between levels 392 and 394, respectively. Drive strength level 392 may be, for example, 100-200 Ohm from a 1.0-1.5V supply (or 5-10 mA). Drive strength level 394 may be, for example, 100-1 kOhm from a reverse biased supply of 1.0-1.5V (or 1-10 mA). In some embodiments, modulator driver circuit 208 may be cutoff (e.g., enter a high-impedance state) after the optical modulator enters second encoding state 314. Cutting off modulator driver circuit 208 in this manner may reduce the power dissipation of the optical data communication system. Embodiments of modulator driver circuit 208 which control the drive strength of optical modulator 106 according to the techniques illustrated in FIG. 3A may be capable of controlling a modulator with a ring resonator 200 embedded in a PIN diode 201 to encode binary data in an optical signal at a rate of approximately 600 Mb/s, with energy dissipation of approximately 4.2 pJ/bit.

Some embodiments of modulator controller 108 may perform pre-emphasis (e.g., sub-symbol pre-emphasis) on the drive strength of optical modulator 106 during signal transitions. In some embodiments, pre-emphasizing the modulator's drive strength may increase the rate at which optical modulator 106 encodes data in an optical signal. In some embodiments, pre-emphasis may be performed by modulating the resistance of a modulator controller connected to a fixed supply voltage, rather than by adjusting the supply voltage or switching between multiple supplies.

Figure 3B:
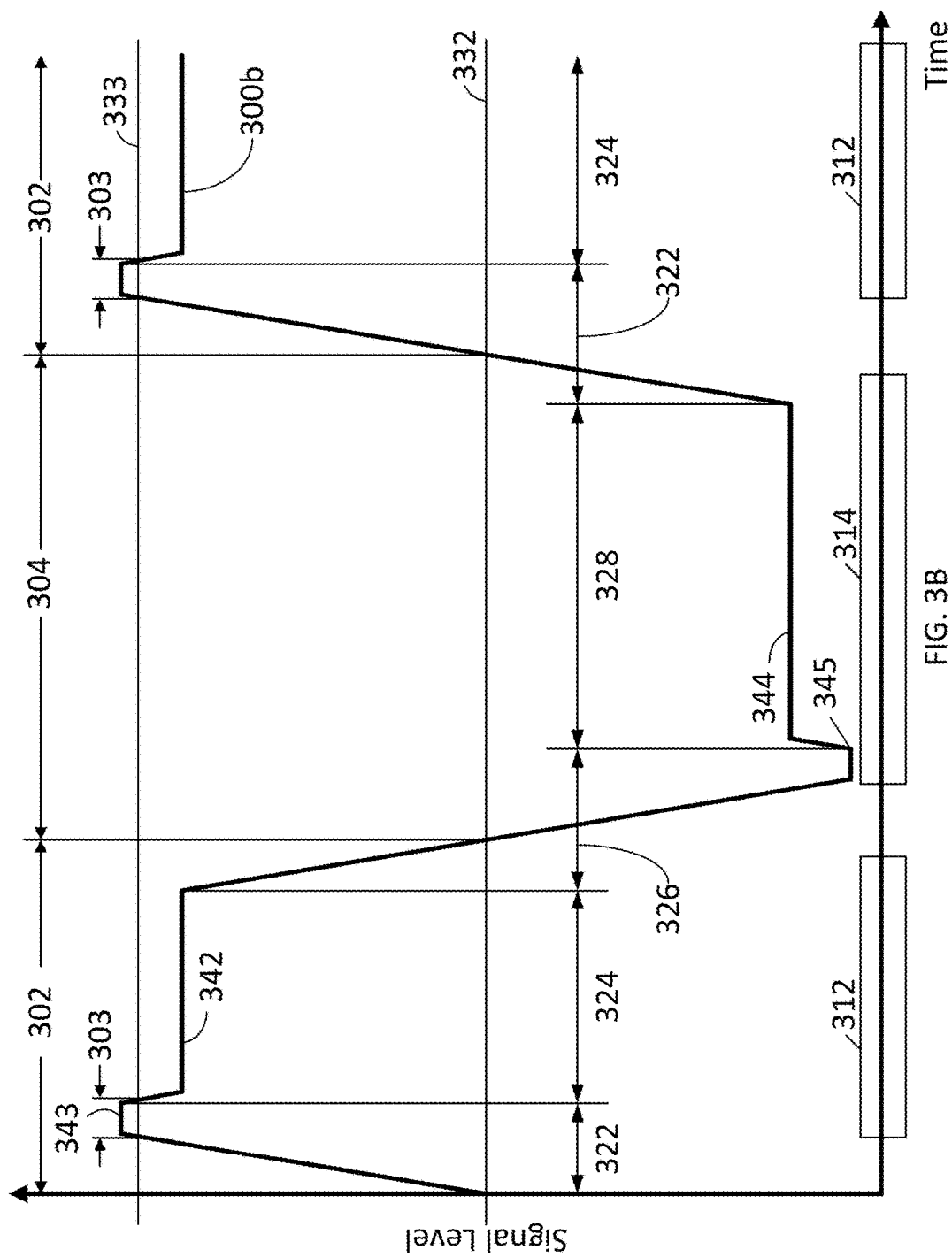
FIG. 3B shows another control signal suitable for controlling an optical modulator, according to some embodiments.

Signal 300b of FIG. 3B illustrates the drive strength of some embodiments of optical modulator 106, during a period of operation. The optical modulator may include a PIN diode 201 in which a ring resonator 200 is embedded. In the example of FIG. 3B, the modulator's drive strength is pre-emphasized during signal transitions. For example, during a transition from level 344 to level 342, the drive strength is pre-emphasized to level 350 before stabilizing at level 342. When the drive strength is at level 350, charge carriers may be injected into the diode's intrinsic region at a rate that exceeds the rate of carrier recombination, thereby rapidly increasing the concentration of charge carriers in the intrinsic region. When the drive strength is at level 342, charge carriers may be injected at a rate sufficient to maintain or slowly increase the elevated concentration of charge carriers.

Likewise, during a transition from level 342 to level 344, the drive strength is pre-emphasized to level 345 before stabilizing at level 344. When the drive strength is at level 345, charge carriers may be rapidly discharged from the diode's intrinsic region, thereby decreasing the concentration of charge carriers. When the drive strength is at level 344, free carriers may be discharged from the intrinsic region or additional free-carriers may not be injected into the intrinsic region to compensate for carrier recombination. Pre-emphasizing the modulator's drive strength during transitions may increase the rate of change of the free carrier concentration in the PIN diode's intrinsic region, thereby increasing the rate at which optical modulator 106 switches between encoding states.

In the example of FIG. 3B, modulator controller 108 adjusts the modulator drive strength relative to a first threshold level 332 and a second threshold level 333. When the drive strength is above the first threshold level 332, optical modulator 106 operates in a first mode of operation 306 (e.g., a forward-biased mode). When the drive strength is above the second threshold level 333, optical modulator 106 may operate in a second mode of operation 308 (e.g., a 'strongly' forward-biased mode 303). In some embodiments, the strongly forward-biased mode 303 may be characterized by the injection of minority charge carriers into optical modulator 106 (e.g., into the intrinsic region of a PIN diode) at a rate that exceeds the rate of carrier recombination. When the drive strength is below the first threshold level 332, optical modulator 106 operates in a third mode of operation 304 (e.g., a reverse biased mode).

Embodiments of modulator driver circuit 208 may control the drive strength of optical modulator 106 according to the techniques illustrated in FIG. 3B. For example, embodiments of modulator driver circuit 208 may control the modulator's drive strength such that pre-emphasis (e.g., sub-bit pre-emphasis) of the drive strength occurs during transitions from level 342 to level 344 (e.g., during the transition from the 1-bit encoding state to the 0-bit encoding state), and/or during transitions from level 344 to level 342 (e.g., during the transition from the 0-bit encoding state to the 1-bit encoding state). Pre-emphasis may accelerate the injection of charge carriers during a transition from a first encoding state to a second encoding state, and may accelerate removal of charge carriers during a transition from the second encoding state to the first encoding state. The pre-emphasized drive strength level 350 may be, for example, 100 Ohm to 400 Ohm from 1.0-1.5V supplies (or 10 mA to 2 mA). The pre-emphasized drive strength level 345 may be, for example, 100 Ohm to 1 kOhm from 1.0-1.5V reverse bias supply. Embodiments of modulator driver circuit 208 which control the drive strength of optical modulator 106 according to the techniques illustrated in FIG. 3B (e.g., by pre-emphasizing the drive strength) may be capable of controlling a modulator with a ring resonator 200 embedded in a PIN diode 201 to encode binary data in an optical signal at a rate of approximately 1 Gb/s, with energy dissipation of approximately 3 pJ/b.

Some embodiments of modulator controller 108 may prime optical modulator 106 for a fast transition from one encoding state to another. Priming the optical modulator may include causing the modulator to switch from a first operating mode associated with a first encoding state to a second operating mode associated with the first encoding state, where the modulator can transition from the second operating mode to a third operating mode associated with a second encoding state more quickly than the modulator can transition from the first operating mode to the third operating mode. In some embodiments, priming the modulator for a fast transition to an encoding state may increase the rate at which the optical modulator encodes data in an optical signal.

Signal 300c of FIG. 3C illustrates the drive strength of some embodiments of optical modulator 106, during a period of operation. The example of FIG. 3C illustrates pre-emphasis and priming techniques. Drive strength levels 350 and 345 of signal 300c illustrate pre-emphasis. The benefits of drive strength pre-emphasis are discussed above with respect to FIG. 3B. Drive strength level 352 of signal 300c illustrates priming of the optical modulator to facilitate faster switching between encoding states.

In the example of FIG. 3C, modulator controller 108 switches the modulator drive strength among levels 342, 345, and 352. When the drive strength is at level 342, charge carriers may be injected at a rate sufficient to maintain or increase a high concentration of charge carriers, as described above with reference to FIG. 3B. When the drive strength is at level 345, charge carriers may be rapidly discharged from the diode's intrinsic region, thereby decreasing the concentration of charge carriers. When the drive strength is at level 352, charge carriers may be slowly injected into the diode's intrinsic region (e.g., at a rate that is lower than or approximately equal to the rate of carrier recombination), thereby maintaining a low concentration of charge carriers. In addition, the resistance of the diode may be lower when the drive strength is at level 352 than when the drive strength is at level 345.

In the example of FIG. 3C, modulator controller 108 adjusts the modulator drive strength relative to a first threshold level 332, a second threshold level 334, and a third threshold level 333. When the drive strength is above the first threshold level 334, optical modulator 106 operates in a first mode of operation 302 (e.g., a forward-biased mode). When the drive strength is below the second threshold level 334 but above the second threshold level 332, optical modulator 106 operates in a second mode of operation 308 (e.g., a 'weakly' forward-biased mode or 'sub-threshold' forward-biased mode). When the drive strength is above the third threshold level 333, optical modulator 106 may operate in a third mode of operation 303 (e.g., a 'strongly' forward-biased mode 303). When the drive strength is below the second threshold level 332, optical modulator 106 operates in a fourth mode of operation 304 (e.g., a reverse biased mode).

In the example of FIG. 3C, while optical modulator 106 is in the first mode of operation 302, the modulator enters a first encoding state 312, in which the modulator encodes a first symbol (e.g., a 1-bit) in the light carried by waveguide 104. Two or more consecutive 1-bits may be optically encoded while the modulator remains in the first encoding state 312. While optical modulator 106 is in the fourth mode of operation 304, the modulator enters a second encoding state 314, in which the modulator encodes a second symbol (e.g., a 0-bit) in the light carried by waveguide 104. Two or more consecutive 0-bits may be optically encoded while the modulator remains in the second encodings state 314 and the fourth operating mode 304. However, when switching from fourth mode of operation 304 to first mode of operation 302, the modulator's switching speed may not be sufficiently fast for some applications. Thus, while optical modulator remains in the second encoding state 314, modulator controller 108 may adjust the modulator's drive strength to a level between the first threshold 334 and the second threshold 332, causing the optical modulator to transition to second operating mode 308. Two or more consecutive 0-bits may be optically encoded while the modulator remains in the second encoding state 314 and the second operating mode 308. Optical modulator 106 may be configured to switch from second encoding state 314 to first encoding state 312 more quickly when the modulator is in second operating mode 308 than when the modulator is in fourth operating mode 304 (e.g., because the resistance between the modulator's terminals is lower in the second operating mode than in the fourth operating mode).

In some embodiments, priming may be applied to an optical modulator which includes a PIN diode 201 in which a ring resonator 200 is embedded. When the drive strength exceeds a first threshold level 334 (e.g., 100-500 Ohm at 1.0-1.5V supply, or 1-10 mA), the PIN diode 201 may operate in a forward-biased mode 302 and/or strongly forward-biased mode 303, causing free charge carriers to be injected into the diode's intrinsic region 210 (e.g., at a rate that exceeds or approximately equals the rate of free-carrier recombination). When the concentration of free charge carriers in the diode's intrinsic region exceeds a threshold concentration (e.g., 1 e19 $cm^{-3}$ to 10 e19 $cm^{-3}$), optical modulator 106 may enter a first encoding state 312, in which ring resonator 200 causes a 1-bit to be encoded in the light carried by waveguide 104. When the drive strength is below the first threshold level 334 but above a second threshold level 332, the PIN diode 201 may operate in a weakly forward-biased mode 308, such that free charge carriers are either not injected into the diode's intrinsic region 210, or are injected at a rate less than or approximately equal to the rate at which charge carriers in the intrinsic region recombine. Thus, the concentration of free charge carriers may remain roughly constant or decrease when the PIN diode is weakly forward-biased. For example, the concentration of charge carriers may be between 0.5 e18 $cm^{-3}$ and 5 e18 $cm^{-3}$ when the PIN diode is weakly forward-biased. When the drive strength is below the second threshold level 332, the PIN diode 201 may operate in a reverse-biased mode 304, in which the concentration of charge carriers in the diode's intrinsic region 210 decreases, because charge carriers are discharged from the intrinsic region or additional free-carriers are not injected to replace free carriers that recombine. When the concentration of free charge carriers in the diode's intrinsic region falls below a threshold concentration (e.g., 0 to 0.5 e17 $cm^{-3}$), optical modulator 106 may enter a second encoding state 314, in which ring resonator 200 causes a 0-bit to be encoded in the light carried by waveguide 104.

The time required by embodiments of optical modulator 106 to transition from the a first encoding state (e.g., a 0-bit encoding state) to a second encoding state (e.g., a 1-bit encoding state) may depend in part on the concentration of free charge carriers in the intrinsic region of PIN diode 201 during the first encoding state. If the concentration of charge carriers in the first encoding state is low, the transition to the second encoding state may have a relatively long duration. By contrast, if the concentration of charge carriers in the first encoding state is higher, the transition to the second encoding state may be quicker.

Embodiments of modulator driver circuit 208 may control the drive strength of optical modulator 106 according to the techniques illustrated in FIG. 3C. For example, embodiments of modulator driver circuit 208 may control the modulator's drive strength such that pre-emphasis (e.g., sub-bit pre-emphasis) of the drive strength occurs during transitions between encoding states, and/or prime optical modulator 106 for fast transitions between encoding states. In some embodiments, modulator driver circuit 208 may prime optical modulator 106 for a fast transition between states by switching the modulator to a mode in which free carriers are injected at a rate less than or approximately equal to the rate of free-carrier recombination, such as a weakly-forward biased mode, after the modulator enters an encoding state.

Embodiments of modulator driver circuit 208 which control the drive strength of optical modulator 106 according to the techniques illustrated in FIG. 3C (e.g., by pre-emphasizing the drive strength during transitions between encoding states, and/or by priming the modulator for fast transitions between encoding states) may be capable of controlling a modulator with a ring resonator 200 embedded in a PIN diode 201 to encode binary data in an optical signal at a rate of approximately 2.5-5.0 Gb/s, with energy dissipation of less than 5 pJ/bit, less than 2 pJ/bit, less than 1.5 pJ/bit, less than 1.25 pJ/bit, or less than 1 pJ/bit. In addition, a modulator 106 controlled in this manner may achieve extinction ratios of better than 3 dB at insertion loss of 3 dB, using supply voltages available in standard CMOS processes. The extinction ratio may improve as the insertion loss is increased.

The signal levels and shapes illustrated in FIGS. 3A-3C are non-limiting examples. In some embodiments, modulator controller 108 may be programmable, such that the levels and shape of the modulator's drive strength characteristic are adjustable. For example, embodiments of modulator controller 108 may allow programmable control of pre-emphasis, such that the optical modulator's drive strength is pre-emphasized during some, all, or no transitions between operating modes or encoding states. As another example, embodiments of modulator controller 108 may allow programmable control of priming, such that the priming of the optical modulator's operating mode is performed before some, all, or no transitions between encoding states. Embodiments of modulator controller 108 may also allow general programmable control of the optical modulator's drive strength. Such general programmable control may permit a user to tune the modulator controller, e.g., to account for process variation or to make tradeoffs between communication bandwidth, optical loss and power dissipation.

Embodiments of a Modulator Controller

Figure 4:
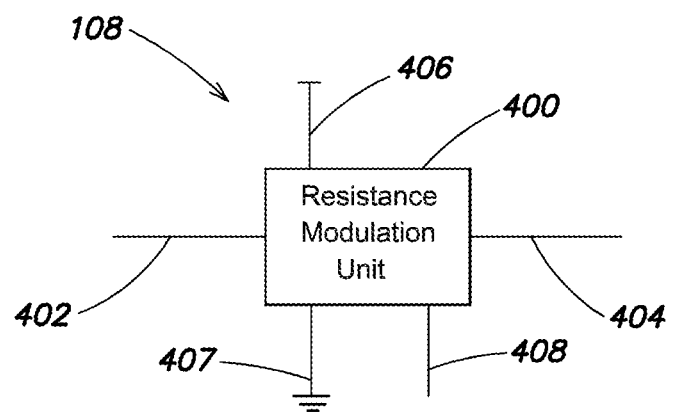
FIG. 4 shows a block diagram of a modulator controller, according to some embodiments.

FIG. 4 shows a block diagram of a modulator controller 108, according to some embodiments. The modulator controller 108 of FIG. 4 includes a resistance modulation unit (RMU) 400, which has a data terminal 402, a supply terminal 406, a ground terminal 407, a control terminal 404, and a configuration terminal 408.

Data terminal 402 may be for receiving data to be optically encoded by an optical modulator. Ground terminal 407 may be for coupling resistance modulation unit (RMU) 400 to ground. Control terminal 404 may be for coupling to an optical modulator 106. Configuration terminal 408 may be for receiving configuration signals associated with programmable control of the RMU's operation. For example, configuration terminal 408 may be configured to permit programmable control of the drive strength of an optical modulator to which modulator controller 108 is coupled.

Supply terminal 406 may be for coupling resistance modulation unit (RMU) 400 to one or more supplies, such as a power supply, voltage source, or current source. For example, in some embodiments supply terminal 406 may be coupled to two voltage supplies VDD and HVDD. In some embodiments, VDD and HVDD may be a core logic power supply and an input/output (I/O) power supply of an integrated circuit fabricated in a standard CMOS process. VDD may have a nominal voltage, for example, between 1.1V and 1.3V. HVDD may have a nominal voltage, for example, of 1.8V. However, embodiments are not limited in this regard. Supply terminal 406 may be for coupling to any on-chip or off-chip supply.

In some embodiments, RMU 400 modulates a resistance between supply terminal 406 and control terminal 404, and/or modulates a resistance between control terminal 404 and ground terminal 407, to control optical encoding of data received on data terminal 402. Embodiments of resistance modulation techniques that use one or more fixed supplies associated with a standard CMOS process may be compatible with a standard CMOS process. By contrast, resistance modulation techniques that use supply switching or supply modulation may not be compatible with a standard CMOS process.

Figure 5:
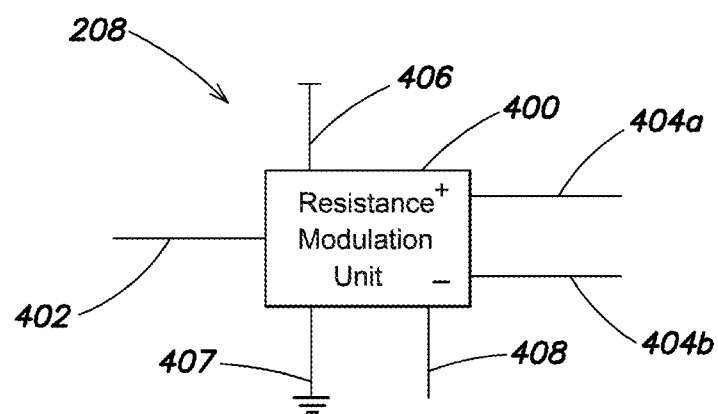
FIG. 5 shows a block diagram of a modulator driver circuit, according to some embodiments.

FIG. 5 shows a block diagram of a modulator driver circuit 208, according to some embodiments. The modulator driver circuit 208 of FIG. 5 includes a resistance modulation unit (RMU) 400, which has a data terminal 402, a supply terminal 406, a ground terminal 407, a configuration terminal 408, and control terminals 404a and 404b. The data, supply, ground, and configuration terminals and their associated functions are described above with reference to FIG. 4. Control terminals 404a and 404b may be for controlling an optical modulator 106. Embodiments of RMU 400 may use resistance modulation to control optical encoding of data received on data terminal 402. Embodiments of RMU 400 may modulate a resistance between control terminal 404a and supply terminal 406, a resistance between control terminal 404a and ground terminal 407, a resistance between control terminal 404b and supply terminal 406, and/or a resistance between control terminal 404b and ground terminal 407.

Embodiments of modulator driver circuit 208 may selectively provide voltages of positive or negative polarity across control terminals 404a and 404b. For example, resistance modulation unit (RMU) 400 may, at one time, provide a higher potential at terminal 404a than at terminal 404b. At another time, RMU 400 may provide a higher potential at terminal 404b than at terminal 404a. In this manner, RMU 400 may selectively apply a positive or negative voltage to an optical modulator 106 coupled to control terminals 404a and 404b.

Figure 6:
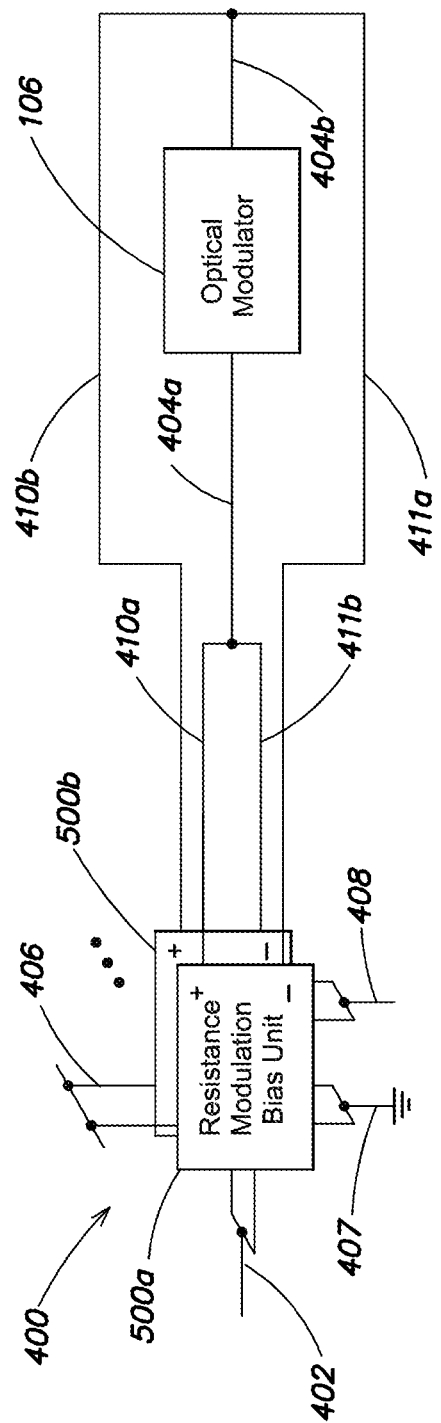
FIG. 6 shows a block diagram of a resistance modulation unit coupled to an optical modulator, according to some embodiments.

FIG. 6 shows a block diagram of resistance modulation unit (RMU) 400 coupled to an optical modulator 106, according to some embodiments. RMU 400 may include one or more resistance modulation bias units (RM bias units) 500. The one or more RM bias units may be used to control the drive strength of an optical modulator coupled to the control terminals. For example, different RM bias units may be used to provide voltages of different polarities to an optical modulator. As another example, different RM bias units may be used to adjust an optical modulator's drive strength. In some embodiments, signals provided by two or more RM bias units 500 on their respective control lines 410 and 411 may be combined to control the drive strength of an optical modulator.

Each of the RMU's one or more RM bias units 500 may be coupled to data terminal 402, supply terminal 406, ground terminal 407, configuration terminal 408, and control lines 410 and 411. The data, supply, ground, and configuration terminals and their associated functions are described above with reference to FIG. 4. Control lines 410 and 411 may be for coupling two or more RM bias units 500 to each other (e.g., to combine the signals generated by the respective RM bias units), and/or for coupling to control terminals 404a and 404b of RMU 400 (e.g., to control an optical modulator 106).

Embodiments of RM bias unit 500 may use resistance modulation to control an optical modulator 106 to optically encode data received on data terminal 402. Embodiments of RM bias unit 500 may modulate a resistance between control line 410 and supply terminal 406, and/or a resistance between control line 411 and ground terminal 407. An RM bias unit may selectively provide a voltage across its control lines 410 and 411, with the higher potential on its control line 410. Likewise, an RM bias unit 500 may selectively place its control lines in a high-impedance state, thereby effectively de-coupling the RM bias unit from RMU control terminals 404a and 404b.

In the embodiment of FIG. 6, RMU 400 includes two resistance modulation bias units (RM bias units) 500a and 500b. RM bias units 500a and 500b may selectively provide positive and negative voltages across control terminals 404a and 404b of RMU 400. As can be seen, in the example of FIG. 6, control lines 410a and 411a of RM bias unit 500a are coupled to the RMU's control terminals 404a and 404b, respectively. By contrast, control lines 410b and 411b of RM bias unit 500b are coupled to the RMU's control terminals 404b and 404a, respectively. Thus, RMU 400 of FIG. 6 may provide a positive voltage across control terminals 404a and 404b by coupling RM bias unit 500a to the control terminals and de-coupling RM bias unit 500b from the control terminals (e.g., by placing control lines 410b and 411b in a high-impedance state). Likewise, RMU 400 may provide a negative voltage across control terminals 404a and 404b by coupling RM bias unit 500b to the control terminals and de-coupling RM bias unit 500a from the control terminals (e.g., by placing control lines 410a and 411a in a high-impedance state).

Figure 7:
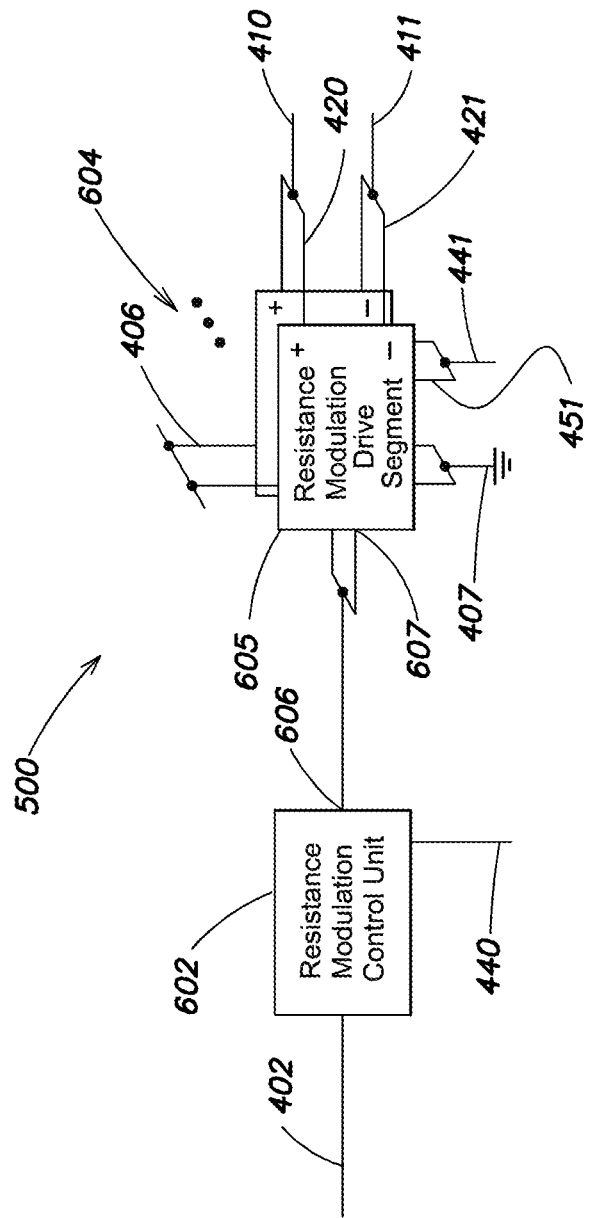
FIG. 7 shows a block diagram of a resistance modulation bias unit, according to some embodiments.

FIG. 7 shows a block diagram of resistance modulation bias unit (RM bias unit) 500, according to some embodiments. In the embodiment of FIG. 7, RM bias unit 500 includes a resistance modulation control unit (RM control unit) 602 and a resistance modulation drive unit (RM drive unit) 604, which includes one or more resistance modulation drive segments (RM drive segments) 605.

In some embodiments, RM control unit 602 may have a data terminal 402, a configuration terminal 440, and a drive unit control terminal 606. Data terminal 402 and its associated functions are described above with reference to FIG. 4. Configuration terminal 440 may be coupled to configuration terminal 408 of RM bias unit 500 and may be for receiving configuration signals associated with programmable control of the RM control unit's operation. In some embodiments, the configuration signals received on configuration terminal 440 may control the delays (e.g., switching delays or propagation delays) of one or more circuit elements in RM control unit 602. In some embodiments, increasing the delays of one or more circuit components may decrease the per-bit energy dissipation of the optical modulation sub-system. Likewise, decreasing the delays of one or more circuit components may increase the optical modulation sub-system's per-bit energy dissipation.

RM control unit 602 may control the operation of RM drive unit 604 based on data to be optically encoded, so that RM drive unit 604 either places its control lines 410 and 411 in a high-impedance state, or provides a signal on control lines 410 and 411 suitable for controlling optical modulator 106 to optically encode the data. In some embodiments, RM control unit 602 may receive data to be optically encoded via data terminal 402. Based on the data to be optically encoded, the RM control unit 602 may generate a drive unit control signal, which is provided to RM drive unit 604 via drive unit control terminal 606. In some embodiments, RM control unit 602 may include a pulse generator circuit that converts the data to be optically encoded into pulses that controls the operation of RM drive unit 604.

As shown in FIG. 7, RM drive unit 604 may have an input terminal 607, a supply terminal 406, a ground terminal 407, a configuration terminal 441, and control lines 410 and 411. The supply terminal 406, ground terminal 407, control lines 410 and 411, and their associated functions are discussed above with respect to FIGS. 4 and 6. Configuration terminal 441 may be coupled to configuration terminal 408 of RM bias unit 500 and may be for receiving configuration signals associated with programmable control of the RM drive unit's operation.

In response to the drive unit control signal received on input terminal 607, embodiments of RM drive unit 604 may perform resistance modulation to control an optical transmitter 106 to optically encode data received by the RM control unit 602. RM drive unit 604 may perform such resistance modulation using one or more RM drive segments 605. The resistance between the RM drive unit's control line 410 and supply terminal 406 may depend on the resistances between the one or more RM drive segments' control terminals 420 and supply terminals 406. For example, the resistance of the RM drive unit 604 between control line 410 and supply terminal 406 may be the parallel combination of the resistances of the one or more RM drive segments 605 between their respective control terminals 420 and supply terminal 406. Likewise, the resistance of the RM drive unit 604 between control line 411 and ground terminal 407 may be the parallel combination of the resistances of the one or more RM drive segments 605 between their respective control terminals 421 and ground terminal 406.

In response to the drive unit control signal provided by RM control unit 602, an RM drive segment 605 may modulate a resistance between control terminal 420 and supply terminal 406, and/or a resistance between control terminal 421 and ground terminal 407. In some embodiments, RM drive segment 605 may include a level-shifter circuit.

Embodiments of modulator controller 400 may perform resistance modulation to adjust the drive strength of optical modulator 106. By enabling and disabling RM bias units and/or RM drive segments, modulator controller 400 may adjust (modulate) the resistance between its control terminals (404a, 404b) and a supply, or the resistance between its control terminals and ground. For example, based on configuration signals received via configuration terminal 408, RMU 400 may activate or deactivate features such as pre-emphasis and priming, and/or control the shape of the optical modulator's drive strength characteristic. Such adjustments may affect the modulation sub-system's bit rate or per-bit energy dissipation. These programmable features may be implemented by activating or deactivating one or more RM bias units 500. The control lines (410, 411) of a deactivated RM bias unit 500 may be placed in a high-impedance state, thereby effectively decoupling the deactivated RM bias unit 500 from the RMU's control terminals (404a, 404b).

As another example, the resistance modulation performed by RM drive unit 604 may be configurable in response to configuration signals received by RMU 400 on terminal 408, which may be coupled to an RM drive unit's configuration terminal 441. In some embodiments, based on such configuration signals, RM drive unit 604 may activate or deactivate one or more RM drive segments 605, thereby adjusting the resistance between control line 410 and supply terminal 406, or the resistance between control line 411 and ground terminal 407. In this manner, RM drive unit 604 may adjust the drive strength of an optical modulator 106 to which RMU 400 is coupled. The control terminals (420, 421) of a deactivated RM drive segment 605 may be placed in a high-impedance state, thereby effectively decoupling the deactivated RM drive segment 605 from the RM drive unit's control lines (410, 411).

As described above, embodiments of RM control unit 602 may generate pulse signals in response to data received via data terminal 402. The durations and timing (e.g., delays) of the pulses may be configurable. FIGS. 8A-8D show schematics of RM control units 602, according to some embodiments. The circuits illustrated in FIGS. 8A-8D are non-limiting examples of pulse-generator circuits, and embodiments are not limited to the illustrated circuits. RM control unit 602 may be implemented, for example, using any circuit known to one of ordinary skill in the art or otherwise suitable for generating a pulse.

FIG. 8A shows a schematic of an RM control unit 602a, according to some embodiments. In the embodiment of FIG. 8A, RM control unit 602a may be configured to generate a negative-going pulse (e.g., an active-low square wave) in response to a rising edge in the data signal received via data terminal 402. As can be seen, the RM control unit 602a of FIG. 8A may include an inverter chain (e.g., two or more series-coupled inverters 804) and a NAND gate 806. In some embodiments, the number of inverters in the inverter chain may be odd. Embodiments of control unit 602a may be suitable for activating a drive unit 604 for a sub-bit period following a low-to-high transition (e.g., a transition from a 0-bit to a 1-bit) in the data to be encoded by optical modulator 106.

Figure 9:
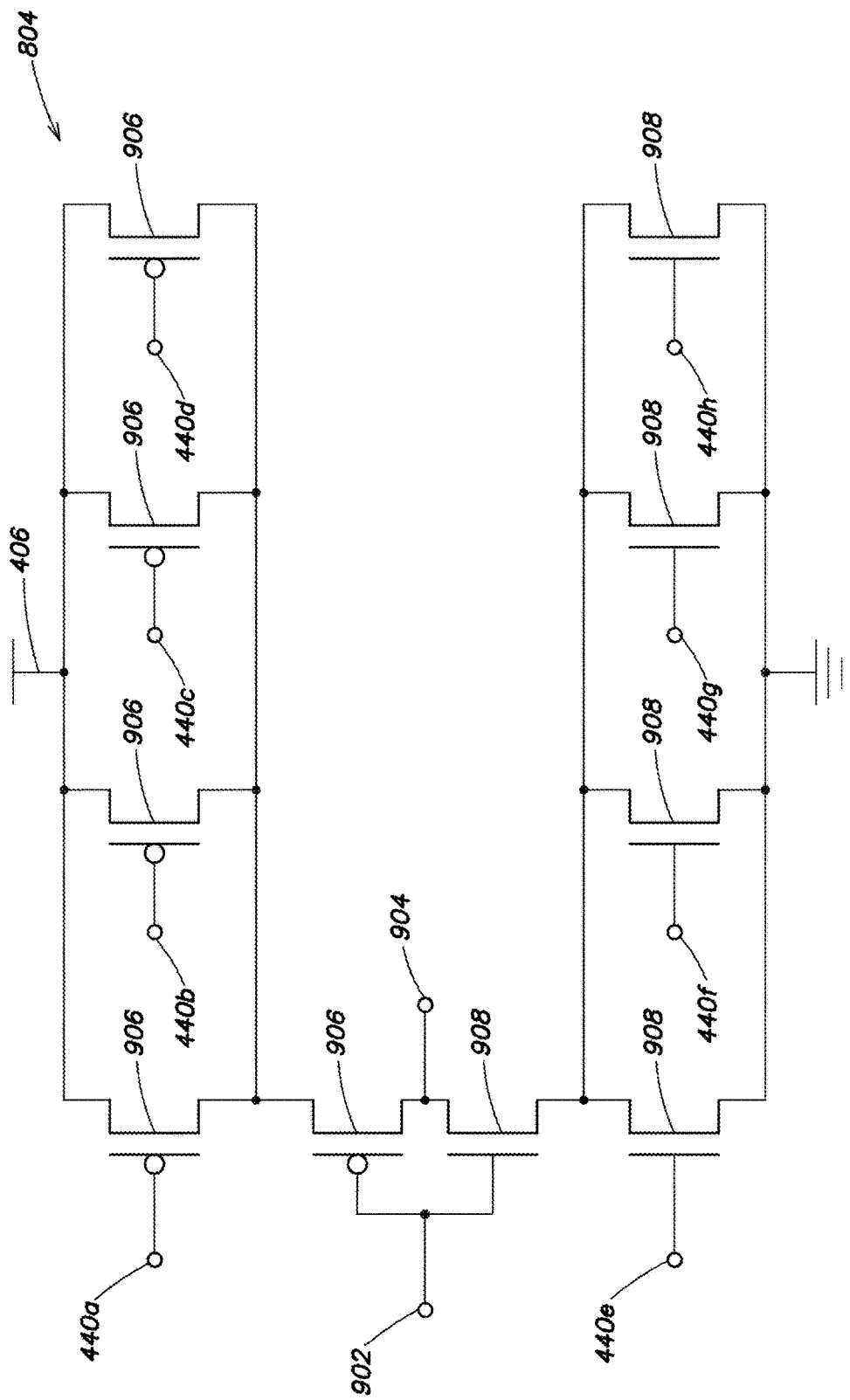
FIG. 9 shows a schematic of an inverter, according to some embodiments.

The duration of the pulse generated by RM control unit 602a may depend on the delay through each inverter 804 and on the number of inverters in the inverter chain. FIG. 9 shows a schematic of an inverter 804, according to some embodiments. In some embodiments, the delay through inverter 804 may be configurable. In the example of FIG. 9, inverter 804 includes multiple p-channel MOSFETs 906 and multiple n-channel MOSFETs 908. The parallel-connected p-channel MOSFETs and the parallel connected n-channel MOSFETs may be controlled by configuration signals received via configuration terminal 440 of the RM control unit. As the number of switched-on pFETs in the set of parallel-connected pFETs increases, the pull-up strength of inverter 804 may increase, thereby decreasing the delay through the inverter on a transition from a low output to a high output. Likewise, as the number of switched-on nFETs in the set of parallel-connected nFETs increases, the pull-down strength of inverter 804 may increase, thereby decreasing the delay through the inverter on a transition from a high output to a low output. The inverter's power dissipation may also increase as the number of switched-on FETs increases.

In some embodiments, one or more of the inverters 804 of RM control unit 602a may be implemented using inverters with configurable delays, such as the inverter of FIG. 9. In such embodiments, the duration of the pulse generated by the RM control unit 602a may be adjusted by adjusting the delays through the inverters. In some embodiments, decreasing the duration of the pulse by reducing the delays through the inverters may result in a corresponding increase in the power dissipation of RM control unit 602a.

FIG. 8B shows a schematic of an RM control unit 602b, according to some embodiments. In the embodiment of FIG. 8B, RM control unit 602b may be configured to generate a negative-going pulse (e.g., an active-low square wave) for the duration of a high data signal (e.g., a 1-bit) received via data terminal 402. As can be seen, the RM control unit 602b of FIG. 8C may include an inverter 804. Embodiments of control unit 602b may be suitable for activating a drive unit 604 for a bit period (or a multi-bit period) following receipt of a 1-bit (or multiple consecutive 1-bits) in the data to be encoded by optical modulator 106.

FIG. 8C shows a schematic of an RM control unit 602c, according to some embodiments. In the embodiment of FIG. 8C, RM control unit 602c may be configured to generate a delayed positive-going pulse (e.g., an active-high square wave) in response to a falling edge in the data signal received via data terminal 402. The pulse may return to a low level in response to a rising edge in the data signal. As can be seen, the RM control unit 602c of FIG. 8C may include an inverter chain (e.g., two or more series-coupled inverters 804), a NOR gate 808, an OR gate 810, and an inverter 804. In some embodiments, the number of inverters in the inverter chain may be odd. Embodiments of control unit 602c may be suitable for activating a drive unit 604 for a bit period (or a multi-bit period) following receipt of a 0-bit (or multiple consecutive 0-bits) in the data to be encoded by optical modulator 106. In some embodiments, the duration of the delay between a high-to-low transition in the data signal and the activation of the pulse may be adjusted by adjusting the delays through the inverters in the inverter chain, in the manner described above.

Figure 8D:
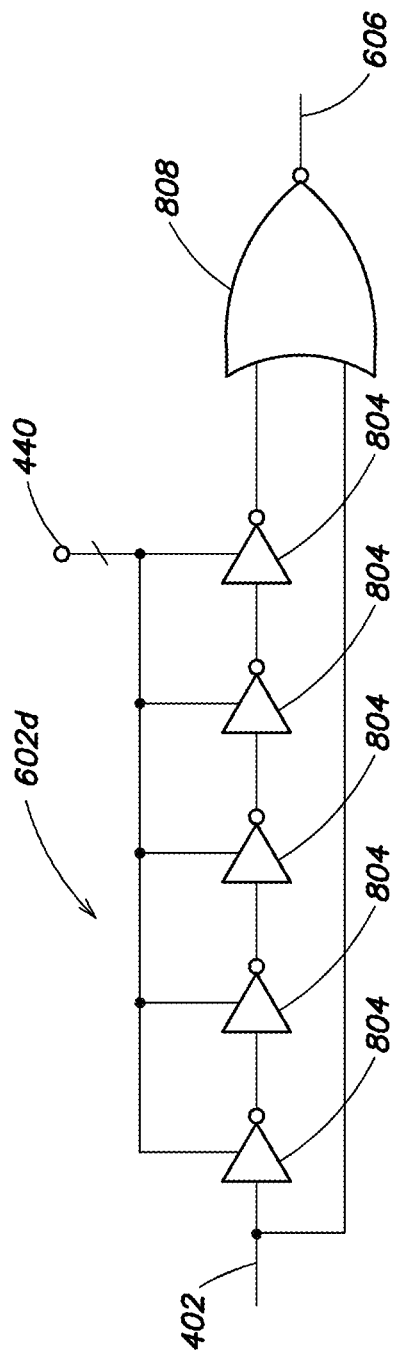

FIG. 8D shows a schematic of an RM control unit 602d, according to some embodiments. In the embodiment of FIG. 8D, RM control unit 602d may be configured to generate a negative-going pulse (e.g., an active-low square wave) in response to a falling edge in the data signal received via data terminal 402. As can be seen, the RM control unit 602d of FIG. 8D may include an inverter chain (e.g., two or more series-coupled inverters 804) and a NOR gate 808. In some embodiments, the number of inverters in the inverter chain may be odd. Embodiments of control unit 602d may be suitable for activating a drive unit 604 for a sub-bit period following a 1-to-0 transition in the data to be encoded by optical modulator 106. In some embodiments, the duration of the pulse generated by the RM control unit 602d may be adjusted by adjusting the delays through the inverters in the inverter chain, in the manner described above.

Figure 10A:
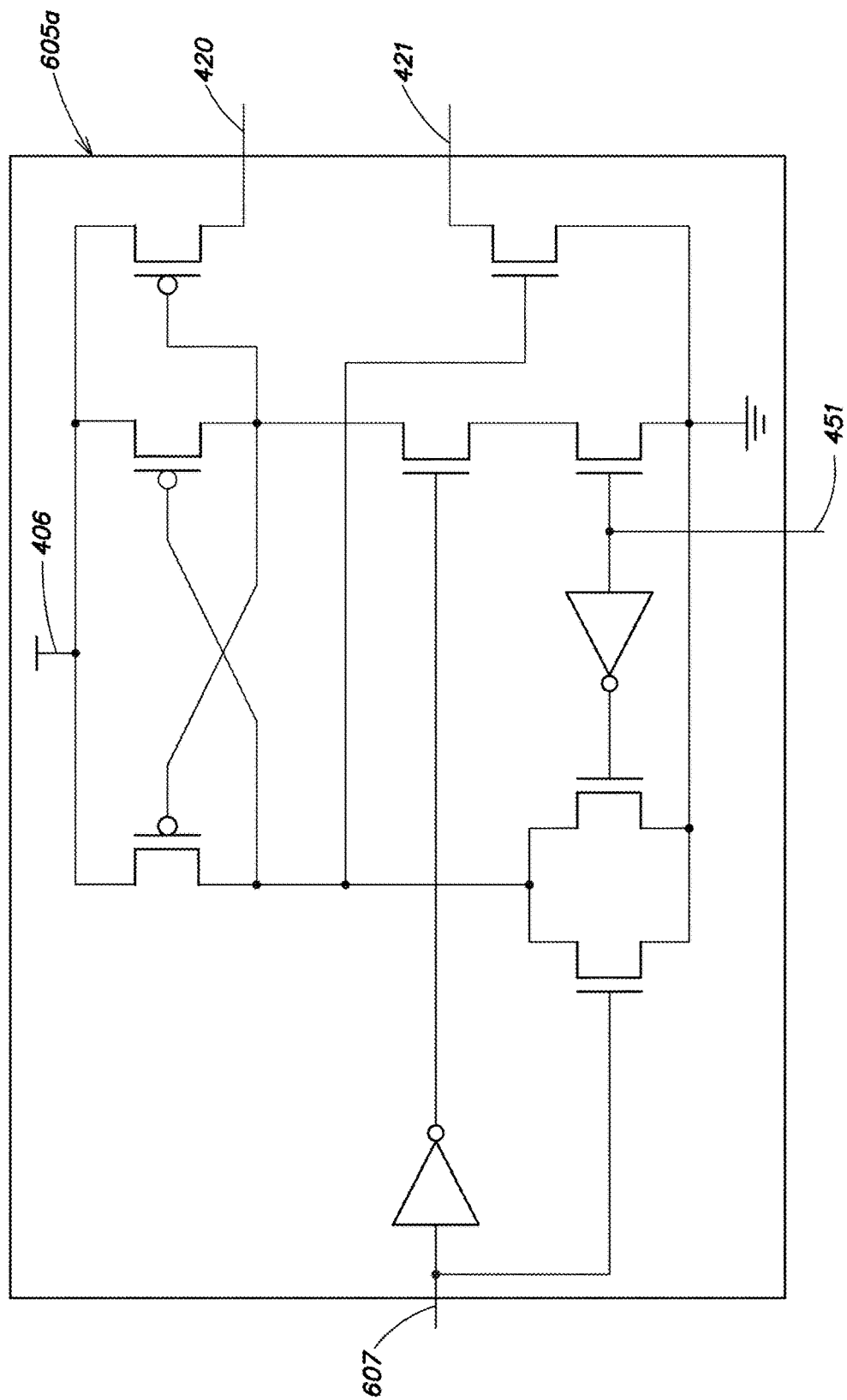
FIGS. 10A-10B show schematics of resistance modulation drive units, according to some embodiments.
Figure 10B:
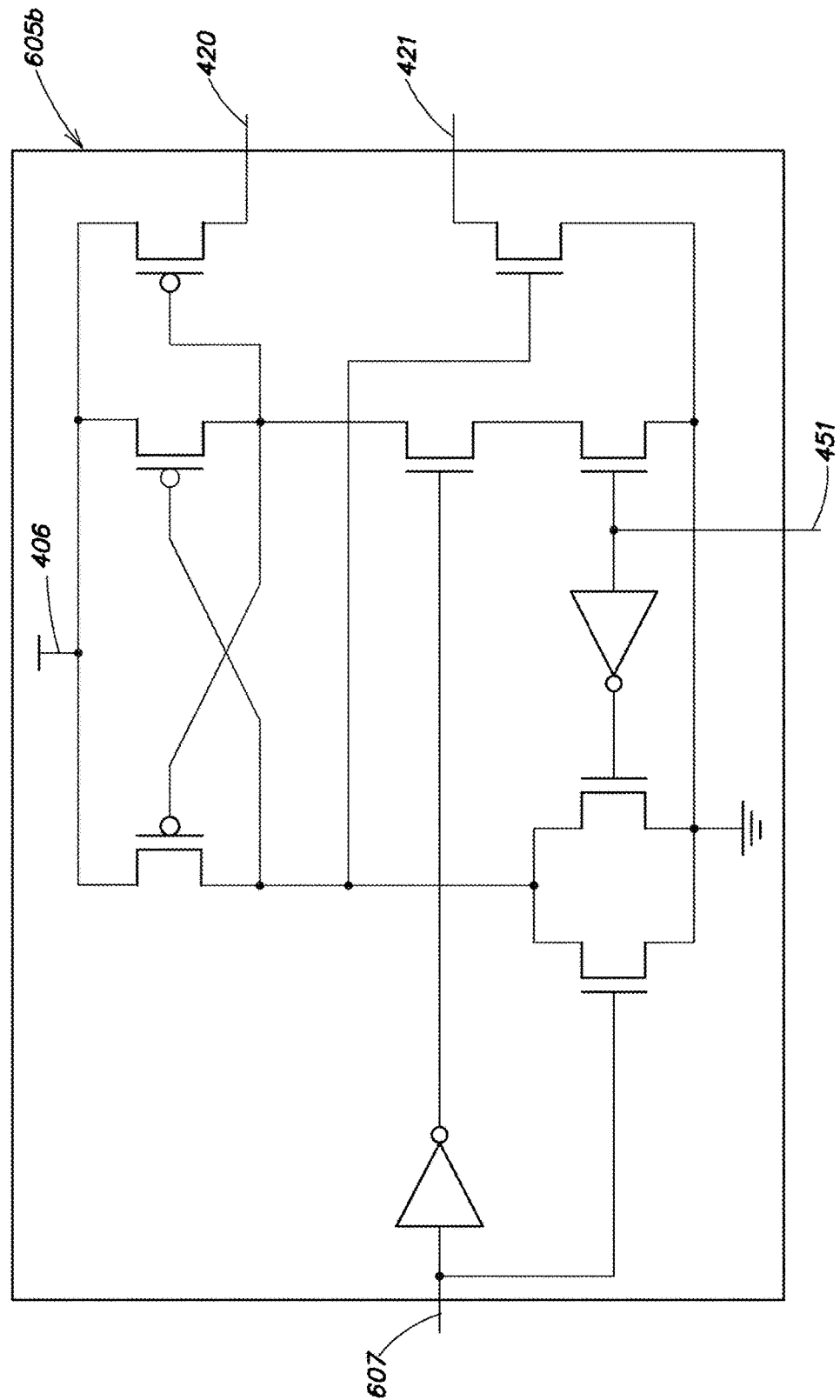

As described above, embodiments of RM drive segments 605 may perform resistance modulation in response to drive unit control signals (e.g., pulses) received from RM control unit 602. FIGS. 10A-10B show schematics of RM control segments 605, according to some embodiments. In some embodiments, RM control segment 605 may be implemented using a tri-state circuit (i.e., a circuit configured to selectively provide high output, low output, or high-impedance output).

FIG. 10A shows a schematic of an RM drive segment 605a, according to some embodiments. In the embodiment of FIG. 10A, RM drive segment 605a may be configured to pull control terminal 420 up to a voltage provided by supply terminal 406 (e.g., an I/O supply voltage HVDD, a core logic supply voltage VDD, or a voltage derived from the I/O supply voltage or the core logic supply voltage) when the drive unit control signal provided at input terminal 607 is low. In addition, RM drive segment 605a may be configured to pull control terminal 421 down to ground when the drive unit control signal provided at input terminal 607 is low. Furthermore, RM drive segment 605a may be configured to place control terminals 420 and 421 in a high-impedance state when the drive unit control signal provided at input terminal 607 is high, and/or when the configuration signal provided at configuration terminal 451 is low.

FIG. 10B shows a schematic of an RM drive segment 605b, according to some embodiments. In the embodiment of FIG. 10B, RM drive segment 605b may be configured to pull control terminal 420 up to a voltage provided by supply terminal 406 (e.g., an I/O supply voltage HVDD, a core logic supply voltage VDD, or a voltage derived from the I/O supply voltage or the core logic supply voltage) when the drive unit control signal provided at input terminal 607 is high. In addition, RM drive segment 605a may be configured to pull control terminal 421 down to ground when the drive unit control signal provided at input terminal 607 is high. Furthermore, RM drive segment 605a may be configured to place control terminals 420 and 421 in a high-impedance state when the drive unit control signal provided at input terminal 607 is low, and/or when the configuration signal provided at configuration terminal 451 is low.

Figure 11A:
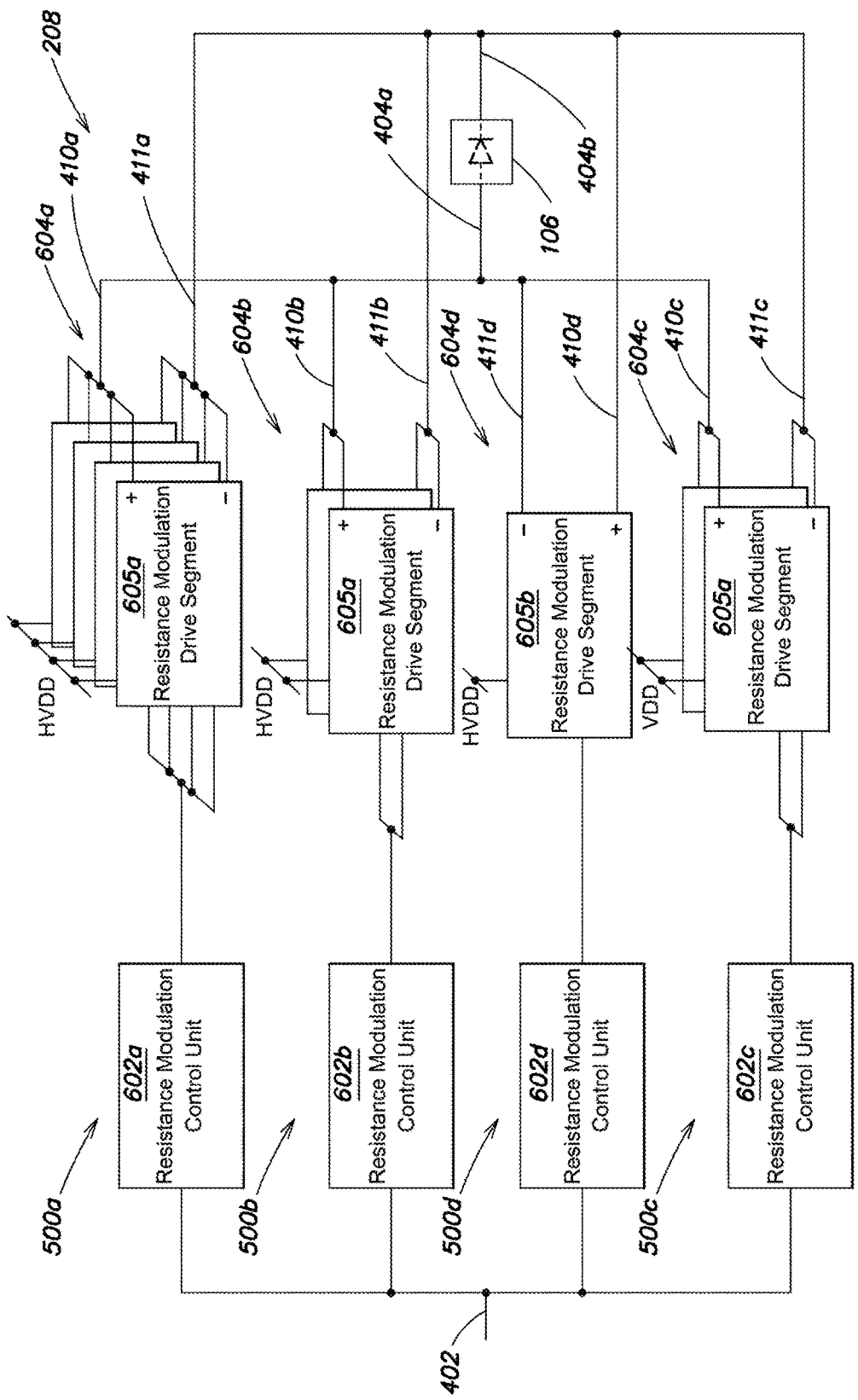
FIGS. 11A-11B show block diagrams of modulator driver circuits, according to some embodiments.

FIG. 11A shows a schematic of a modulator driver circuit 208, according to some embodiments. In some embodiments, the modulator driver circuit 208 of FIG. 11A may be implemented as a digital push-pull circuit with configurable drive strengths, capable of performing sub-bit pre-emphasis and/or priming. The embodiment of FIG. 11A may be suitable for controlling an optical modulator 106, which may include a ring resonator embedded in a PIN diode. The embodiment of FIG. 11A may be configured to pre-emphasize the optical modulator's drive strength during low-to-high and high-to-low transitions. The embodiment of FIG. 11A may also be configured to prime optical modulator 106 for a fast transition from a 0-bit encoding state to a 1-bit encoding state. Embodiments of the optical modulation system illustrated in FIG. 11A may operate at a high bit rate (e.g., 2.5 Gb/s) and with low energy dissipation (e.g., 1.2 pJ/b).

In the embodiment of FIG. 11A, modulator driver circuit 208 includes four resistance modulation bias units (RM bias units) 500a-500d. The data terminal 402 of each RM bias unit is for receiving data to be optically encoded. The control terminals 410 and 411 of each RM bias unit are coupled to the control terminals 404a and 404b of optical modulator 106 in the manner illustrated. In some embodiments, optical modulator 106 may include a ring resonator embedded in a PIN diode, with control terminal 404a coupled to the diode's anode and control terminal 404b coupled to the diode's cathode.

In the embodiment of FIG. 11A, RM bias unit 500a includes an RM control unit 602a, such as the RM control unit 602a illustrated in FIG. 8A, and an RM drive unit 604a with one or more (e.g., four) RM drive segments 605a, such as the RM drive segments 605a illustrated in FIG. 10A. RM bias unit 500b includes an RM control unit 602b, such as the RM control unit 602b illustrated in FIG. 8B, and an RM drive unit 604b with one or more (e.g., two) RM drive segments 605a, such as the RM drive segments 605a illustrated in FIG. 10A.

In some embodiments, the operation of RM bias units 500a and 500b may be illustrated in FIG. 3C. When the data to be encoded by the optical modulator switches from a 0-bit to a 1-bit, modulator driver circuit 208 may enter a mode of operation 322 in which RM bias units 500a and 500b control the drive strength of optical modulator 106 according to the resistance they provide between the RMU's control terminals (404a, 404b) and supply 406 or ground 407. In FIG. 3C, portion 350 of the drive strength characteristic 300c represents the steady-state drive strength of optical modulator 106 when RM bias units 500a and 500b are active. As the concentration of charge carriers in the PIN diode's intrinsic region increases, optical modulator 106 may enter encoding state 312 (e.g., a 1-bit encoding state). Shortly after the data to be encoded switches to a 1-bit, modulator driver circuit 208 may enter a mode of operation 324 in which the control lines of RM bias unit 500a are in a high-impedance state, and RM bias unit 500b controls the drive strength as indicated by portion 342 of signal 300c. Modulator driver circuit 208 may remain in mode of operation 324, and optical modulator 106 may remain in encoding state 312, at least until the data to be encoded switches to a 0-bit. When the data to be encoded switches to a 0-bit, RM bias unit 500b may place its control terminals in a high-impedance state. In other words, RM bias units 500a and 500b may collectively pre-emphasize the optical modulator's drive strength when the data to be encoded switches from a 0-bit to a 1-bit, thereby forward-biasing the PIN diode, and RM bias unit 500b may continue to forward-bias the PIN diode while the data to be encoded remains a 1-bit.

In the embodiment of FIG. 11A, RM bias unit 500d includes an RM control unit 602d, such as the RM control unit 602d illustrated in FIG. 8D, and an RM drive unit 604d with one or more (e.g., one) RM drive segment 605b, such as the RM drive segments 605b illustrated in FIG. 10B. RM bias unit 500c includes an RM control unit 602c, such as the RM control unit 602c illustrated in FIG. 8C, and an RM drive unit 604c with one or more (e.g., two) RM drive segments 605a, such as the RM drive segments 605a illustrated in FIG. 10A.

In some embodiments, the operation of RM bias units 500d and 500c may be illustrated in FIG. 3C. When the data to be encoded by the optical modulator switches from a 1-bit to a 0-bit, modulator driver circuit 208 may enter a mode of operation 326 in which RM bias unit 500d controls the drive strength of optical modulator 106 according to the resistance it provides between the RMU's control terminals (404a, 404b) and supply 406 or ground 407. In FIG. 3C, portion 351 of the drive strength characteristic 300c represents the steady-state drive strength of optical modulator 106 when RM bias unit 500d is active. As the concentration of charge carriers in the PIN diode's intrinsic region decreases, optical modulator 106 may enter encoding state 314 (e.g., a 0-bit encoding state). Shortly after the data to be encoded switches to a 0-bit, modulator driver circuit 208 may enter a mode of operation 328 in which the control terminals of RM bias unit 500d are in a high-impedance state, and RM bias unit 500c controls the drive strength of optical modulator 106 as indicated by portion 352 of signal 300c. Modulator driver circuit 208 may remain in mode of operation 328, and optical modulator 106 may remain in encoding state 314, at least until the data to be encoded switches to a 1-bit. In other words, RM bias units 500d and 500c may collectively pre-emphasize the optical modulator's drive strength when the data to be encoded switches from a 1-bit to a 0-bit, thereby reverse-biasing the PIN diode, and RM bias unit 500c may weakly forward-bias the PIN diode while the data to be encoded remains a 0-bit.

Figure 11B:
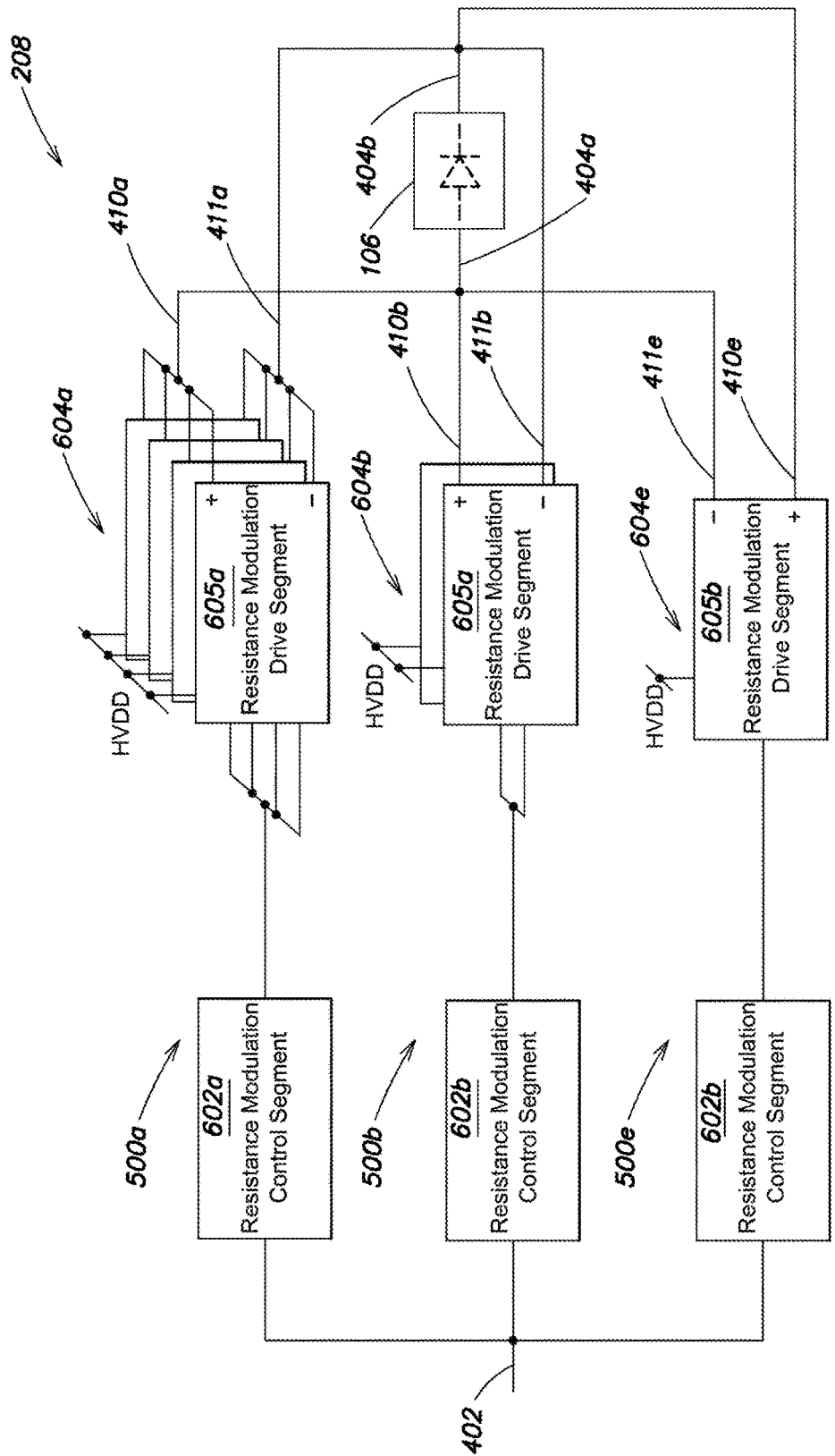

FIG. 11B shows a schematic of a modulator driver circuit 208, according to some embodiments. The embodiment of FIG. 11B may be suitable for controlling the drive strength of optical modulator 106, which may include a ring resonator embedded in a PIN diode. The embodiment of FIG. 11B may be configured to pre-emphasize the optical modulator's drive strength during low-to-high transitions. Embodiments of the optical modulation system illustrated in FIG. 11B may operate at a high bit rate (e.g., 600 Mb/s).

In the embodiment of FIG. 11B, modulator driver circuit 208 includes three resistance modulation bias units (RM bias units) 500a, 500b, and 500e. The data terminal 402 of each RM bias unit is for receiving data to be optically encoded. The control terminals 410 and 411 of each RM bias unit are coupled to the control terminals 404a and 404b of optical modulator 106 in the manner illustrated. In some embodiments, optical modulator 106 may include a ring resonator embedded in a PIN diode, with control terminal 404a coupled to the diode's anode and control terminal 404b coupled to the diode's cathode.

The implementations and operations of RM bias units 500a and 500b are described above with reference to FIG. 11A.

In the embodiment of FIG. 11B, RM bias unit 500e includes an RM control unit 602b, such as the RM control unit 602b illustrated in FIG. 8B, and an RM drive unit 604e with one or more (e.g., one) RM drive segment 605b, such as the RM drive segments 605b illustrated in FIG. 10B. In some embodiments, the operation of RM bias unit 500e may be illustrated in FIG. 3A. When the data to be encoded by the optical modulator switches from a 1-bit to a 0-bit, modulator driver circuit 208 may enter a mode of operation 326 in which RM bias unit 500d controls the drive strength of optical modulator 106 according to the resistance it provides between the RMU's control terminals (404a, 404b) and supply 406 or ground 407. In FIG. 3A, portion 344 of the drive strength characteristic 300a represents the steady-state drive strength of optical modulator 106 when RM bias unit 500e is active. As the concentration of charge carriers in the PIN diode's intrinsic region decreases, optical modulator 106 may enter encoding state 314 (e.g., a 0-bit encoding state). Modulator driver circuit 208 may remain in mode of operation 326, and optical modulator 106 may remain in encoding state 314, at least until the data to be encoded switches to a 1-bit. In other words, RM bias unit 500e reverse-bias the PIN diode while the data to be encoded remains a 0-bit.

Embodiments of a Modulator Control Method

Figure 12:
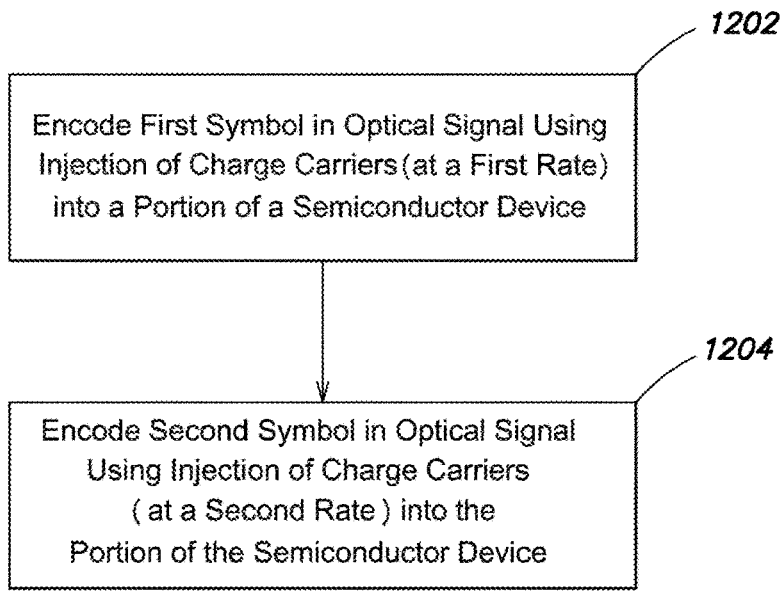
FIG. 12 shows a flowchart of a method of encoding a first symbol and a second symbol in an optical signal, according to some embodiments.

FIG. 12 shows a flowchart of a method of encoding a first symbol and a second symbol in an optical signal, according to some embodiments. The optical signal may be carried by an optical waveguide, which may be formed from silicon, polysilicon, and/or another silicon-based material. An optical property of the waveguide, such as its refraction index, may depend on a concentration of charge carriers in a portion of a semiconductor device, which may be a component of an optical modulator. For example, an optical property of the waveguide may depend on a concentration of charge carriers in an intrinsic region (portion) of a PIN diode (semiconductor device) in which a ring resonator is embedded.

At act 1202 of the illustrated method, a first symbol may be encoded in the optical signal. The first symbol may represent, for example, a binary digit, such as 1. However, embodiments are not limited in this regard. In some embodiments, the first symbol may represent any digit of an N-symbol code (where N is a finite number), such as a hexadecimal digit of a 16-symbol code.

Encoding the first symbol in the optical signal may include injecting charge carriers, at a first rate, into the portion of the semiconductor device (e.g., the intrinsic region of the PIN diode). In some embodiments, injection of charge carriers at the first rate may be achieved by applying a forward bias voltage to the semiconductor device (e.g., PIN diode). The forward bias voltage may be any voltage that exceeds a threshold voltage of the semiconductor device.

In some embodiments, encoding the first symbol in the optical signal may also include injecting charge carriers, at a third rate, into the portion of the semiconductor device (e.g., the intrinsic region of the PIN diode). In some embodiments, injection of charge carriers at the third rate may be achieved by applying a forward bias voltage to the semiconductor device (e.g., PIN diode). This forward-bias voltage may be a voltage that is greater than a threshold voltage of the semiconductor device.

The injection of charge carriers at the third rate may occur prior to the injection of charge carriers at the first rate. In some embodiments, the injection of charge carriers at the third rate may occur immediately prior to the injection of charge carriers at the first rate. The third rate of charge carrier injection may be greater than the first rate of charge carrier injection. In some embodiments, the drive strength of the semiconductor device during injection of charge carriers at the third rate may exceed the drive strength of the semiconductor device during injection of charge carriers at the first rate. Thus, injection of charge carriers in this manner may correspond to pre-emphasis of the semiconductor component's drive strength.

At act 1204 of the illustrated method, a second symbol may be encoded in the optical signal. The second symbol may represent, for example, a binary digit, such as 0. However, embodiments are not limited in this regard. In some embodiments, the second symbol may represent any digit of an N-symbol code (where N is a finite number), such as a hexadecimal digit of a 16-symbol code.

Encoding the second symbol in the optical signal may include injecting charge carriers, at a second rate, into the portion of the semiconductor device (e.g., the intrinsic region of the PIN diode). In some embodiments, injection of charge carriers at the first rate may be achieved by applying a forward bias voltage to the semiconductor device (e.g., PIN diode). The forward bias voltage may be a weak forward-bias voltage (e.g., a forward voltage that does not exceed a threshold voltage of the semiconductor device). In some embodiments, the drive strength of the semiconductor device during injection of charge carriers at the first rate may exceed the drive strength of the semiconductor device during injection of charge carriers at the second rate.

In some embodiments, encoding the second symbol in the optical signal may also include preventing injection of charge carriers into, or depleting charge carriers from, the portion of the semiconductor device (e.g. the intrinsic region of the PIN diode). In some embodiments, preventing injection of charge carriers or depleting charge carriers may be achieved by applying a reverse bias voltage to the semiconductor device (e.g., PIN diode). This reverse-bias voltage may be a voltage that is less than a zero volts (e.g., a voltage with a higher potential at the cathode of the semiconductor device and a lower potential at the anode of the semiconductor device).

The prevention of injection or the depletion of charge carriers may occur prior to the injection of charge carriers at the second rate (e.g., immediately prior). In some embodiments, the drive strength of the semiconductor device during prevention of injection or during depletion of charge carriers may be less than the drive strength of the semiconductor device during injection of charge carriers at the second rate. Thus, the prevention of injection or the depletion of charge carriers in this manner may correspond to pre-emphasis of the semiconductor component's drive strength.

While some above-described embodiments relate to modulating an optical signal by using a PIN diode to control injection of charge carriers into a region of a semiconductor, other embodiments are not limited in this manner. In some embodiments, an optical signal may be modulated by using a carrier-concentration controller, such as a PN-junction diode or a MOS capacitor, to control injection, depletion, or accumulation of charge carriers in a region of a semiconductor.

Embodiments of an Integrated Circuit Fabrication Method

Figure 13:
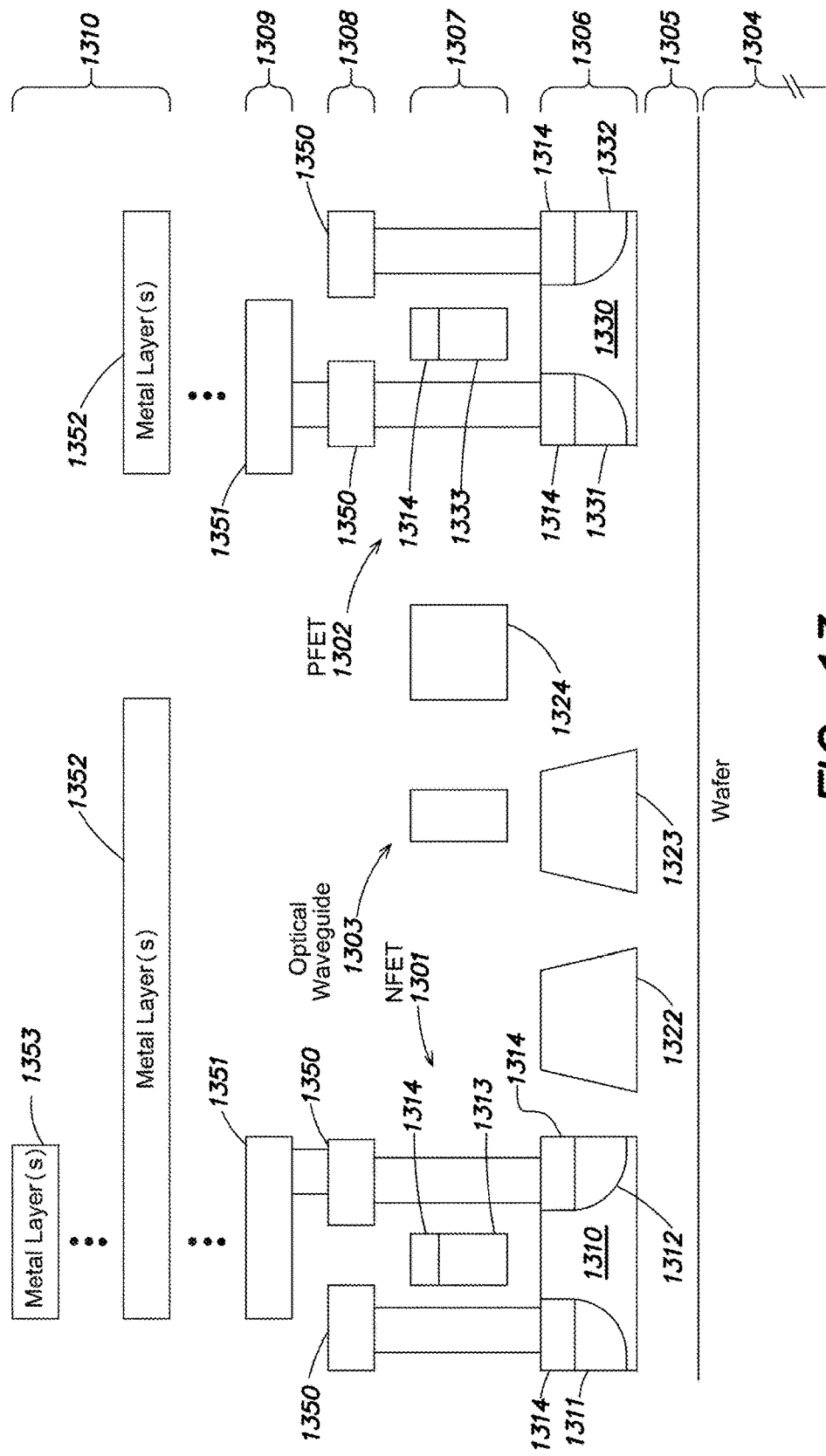
FIG. 13 illustrates components of an optical data communication system in layers of a standard CMOS process, according to some embodiments.

FIG. 13 illustrates components of an optical data communication system (e.g., a silicon photonic system) fabricated in layers of a standard CMOS process, according to some embodiments. In some embodiments, the standard CMOS process may be silicon-on-insulator (SOI) process which includes a buried-oxide layer 1305, a body-silicon layer 1306, a gate-polysilicon layer 1307, a first metal layer 1308, one or more oxide/nitride/low-k dielectric layers 1309, and one or more additional metal layers 1310, which are fabricated on a wafer 1304 (e.g., a silicon handle wafer).

In the embodiment of FIG. 13, an nFET 1301, a pFET 1302, and an optical waveguide 1321 are fabricated in the body-silicon layer 1306 and the gate-polysilicon layer 1307 of the standard CMOS process. The nFET 1301 may include a p-doped silicon region 1310, n+ diffusion regions 1311 and 1312, and an n+ polysilicon gate 1313. The pFET 1302 may include an n-doped silicon region 1330, p+ diffusion regions 1331 and 1332, and a p+ polysilicon gate 1313. In some embodiments, strained silicon techniques may be used to fabricate the nFET 1301 and/or pFET 1302. In some embodiments, the gate and diffusion regions of the pFET and/or nFET may be capped with a layer of nickel silicide (NiSi) 1314.

In some embodiments, the optical waveguide may include a body-silicon waveguide core portion 1322 and/or a strip-loaded waveguide core portion 1323, both of which may be fabricated in the body-silicon process layer 1306 with the bodies of the nFET 1301 and pFET 1302. In some embodiments, the optical waveguide may include a polysilicon waveguide core portion 1324, which may be fabricated in the gate-polysilicon layer process layer 1307 with the gates of the nFET 1301 and pFET 1302.

In some embodiments, the thicknesses of the buried-oxide layer 1305, body-silicon layer 1306, and gate-polysilicon layer 1307 may be, for example, 100-200 nm, 80-120 nm, and 65-100 nm. However, embodiments are not limited in this regard. In some embodiments, the thicknesses of the various processing layers may be the process layer thicknesses associated with standard CMOS processing nodes (e.g., the process layer thicknesses associated with a 130 nm node, a 90 nm node, a 65 nm node, a 45 nm node, a 32 nm node, a 22 nm node, a 14 nm node, a 10 nm node, a 7 nm node, or a 5 nm node).

Embodiments of a standard CMOS process are not limited to the exemplary SOI process described above and illustrated in FIG. 13. In some embodiments, the standard CMOS process may be, for example, a gate-first SOI process or a gate-last SOI process. In some embodiments the standard CMOS process may be, for example, a bulk process (e.g., a gate-first bulk process or a gate-last bulk process). In some embodiments, the number of supplies available in a standard CMOS process may be limited, for example, to 2-3. In some embodiments, the voltage headroom in a standard CMOS process may be restricted, for example to 1-2V, e.g., due to transistor leakage and/or gate oxide and drain-source junction break voltages. In some embodiments, a process may not be a standard CMOS process if the process does not produce a chip comprising at least one NMOS transistor and at least one PMOS transistor.

Figure 14:
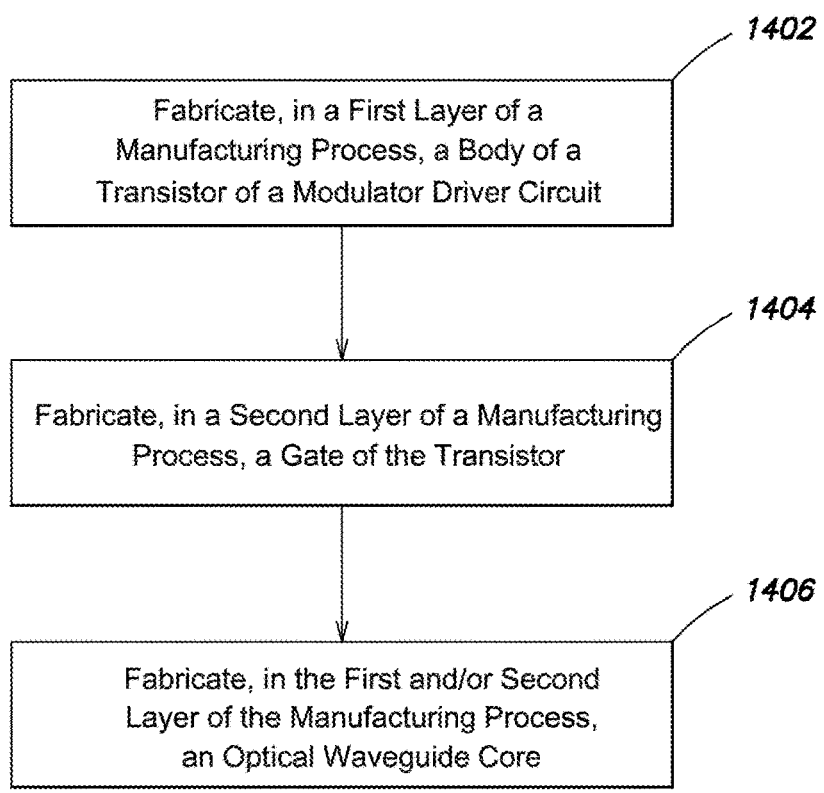
FIG. 14 shows a flowchart of a method of fabricating an integrated circuit in a manufacturing process, according to some embodiments.

FIG. 14 shows a flowchart of a method of fabricating an integrated circuit in a manufacturing process, according to some embodiments. The integrated circuit may be a monolithic integrated circuit, and the manufacturing process may be a standard CMOS process. For example, the manufacturing process may be a standard CMOS process in a sub-130 nm technology node, such as a 130 nm process, a 90 nm process, a 65 nm process, a 45 nm process, a 32 nm process, a 28 and/or 22 nm process, a 14 nm process, a 11 nm process, a 7 nm process, or a 5 nm process.

At act 1402, in a first layer of the manufacturing process, a body of a transistor is fabricated. The layer of the manufacturing process may be a front-end body-silicon layer. The transistor may be a component of a modulator driver circuit configured to control an optical modulator. The optical modulator may use a semiconductor device, such as a PIN diode with a ring resonator embedded in its intrinsic region, to encode data in optical signals carried by an optical waveguide. The transistor may be configured to modulate a resistance between the optical modulator and a supply (e.g., a core logic power supply or an I/O power supply).

At act 1404, a gate of the transistor may be fabricated in a second layer of the manufacturing process. The layer of the manufacturing process may be a front-end gate-polysilicon layer.

At act 1406, an optical waveguide core may be fabricated in the first and/or second layer of the manufacturing process. The waveguide core may be a rib waveguide core or a strip waveguide core. In some embodiments, the transistor may modulate a drive strength of a semiconductor device (e.g., a PIN diode) that controls the encoding of optical data in an optical signal carried by the waveguide core.

In some embodiments, the method may also include fabricating a diode in the first layer of the manufacturing process. In some embodiments, the diode may be a PIN diode and a portion of the optical waveguide core may be embedded in a portion of the PIN diode, such as the intrinsic region. In some embodiments, the diode may be a PN junction diode and a portion of the optical waveguide core may be embedded in a portion of the PN-junction diode.

Additional Embodiments

Embodiments of the devices and techniques described herein may be used in a broad range of applications, including but not limited to on-chip optical links, chip-to-chip optical links, multi-socket processor coherency traffic interfaces, processor-to-DRAM interfaces, network routers, field-programmable gate arrays (FPGAs), circuit board interconnects, backplane interconnects, rack interconnects, data center interconnects, and digital system interconnects (e.g., Fibre-Channel, PCIExpress, GigabitEthernet, etc.).

Described herein are embodiments of an N-symbol optical modulator which modulates one or more properties of light to encode symbols from an N-symbol alphabet. In some embodiments, an N-symbol optical modulator may "actively modulate" (e.g., modify) one or more properties of light to encode a symbol (e.g., if the properties of the light provided to the optic modulator do not already correspond to the desired symbol), or may "passively modulate" one or more properties of the light to encode a symbol (e.g., if the properties of the light provided to the optical modulator already correspond to the symbol, such that modification is unnecessary). The term "modulate," as used herein, encompasses both active and passive modulation.

References are made above to 'high' and 'low' signals or signals with 'high' and 'low' values. One of ordinary skill in the art will understand that digital electronic devices discriminate between signal values that correspond to binary digits 0 and 1, and that the term 'high' typically refers to signals that correspond to binary digit 1, while the term 'low' typically refers to signals that correspond to binary digit 0. Embodiments are not limited by the voltages or other signal values by which high signals are distinguished from low signals.

Embodiments are not limited to monolithic integration in a standard CMOS process. In some embodiments, the devices described herein may be fabricated in a non-standard CMOS process, a heterogeneous fabrication process, or any other integrated circuit fabrication process known to one of ordinary skill in the art.

The term 'light,' as used herein, is not limited to visible light. In some embodiments, the optical signals used for optical data communication may have wavelengths in the visible, near-infrared, infrared, and/or ultraviolet portions of the electromagnetic spectrum. In some embodiments, the optical signals of an optical data communication technology may have wavelengths of at least 400 nm. In some embodiments, optical signals may have wavelengths of at least 1100 nm. Embodiments are not limited in this regard.

The waveforms illustrated in FIGS. 3A-3C are non-limiting examples of waveform conditioning that embodiments of modulator driver circuit 208 may perform. Embodiments of modulator driver circuit 208 may condition a waveform (e.g., drive strength signal waveform) of any suitable carrier-concentration controller (e.g., PIN diode, PN-junction diode, or MOS capacitor) in any suitable way. Embodiments are not limited in this regard.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Various embodiments may be configured as described below:

(A1) A method of encoding a first symbol and a second symbol in an optical signal carried by a waveguide, an optical property of the waveguide depending on a concentration of charge carriers in a portion of a semiconductor device, the method comprising: encoding the first symbol in the optical signal, wherein encoding the first symbol includes injecting charge carriers, at a first rate, into the portion of the semiconductor device; and encoding the second symbol in the optical signal, wherein encoding the second symbol includes injecting charge carriers, at a second rate, into the portion of the semiconductor device, wherein the first rate is greater than the second rate.

(A2) The method of (A1), wherein injecting charge carriers at the first rate comprises applying a forward bias voltage to the semiconductor device while controlling a drive strength of the semiconductor device, the forward bias voltage exceeding a threshold voltage of the semiconductor device.

(A3) The method of any of (A1) to (A2), wherein injecting charge carriers at the second rate comprises applying a forward bias voltage to the semiconductor device while controlling a drive strength of the semiconductor device, the forward bias voltage not exceeding a threshold voltage of the semiconductor device.

(A4) The method of any of (A1) to (A3), wherein: encoding the first symbol further comprises performing pre-emphasis of charge carrier injection by injecting charge carriers, at a third rate, into the portion of the semiconductor device, prior to injecting charge carriers at the first rate, and the third rate is greater than the first rate.

(A5) The method of (A4), wherein injecting charge carriers at the third rate comprises applying a forward bias voltage to the semiconductor device while controlling a drive strength of the semiconductor device, the forward bias voltage exceeding a threshold voltage of the semiconductor device, wherein the drive strength of the semiconductor device during injection of charge carriers at the third rate exceeds the drive strength of the semiconductor device during injection of charge carriers at the first rate.

(A6) The method of any of (A1) to (A5), wherein encoding the second symbol further comprises depleting charge carriers from the portion of the semiconductor device prior to injecting the charge carriers at the second rate.

(A7) The method of (A6), wherein depleting charge carriers from the portion of the semiconductor device comprises applying a reverse bias voltage to the semiconductor device.

(A8) The method of any of (A1) to (A7), wherein: the semiconductor device is a PIN diode, and the portion of the semiconductor device is an intrinsic region of the PIN diode.

(B1) An integrated circuit for controlling an optical modulator, the optical modulator configured to encode data in an optical signal carried by an optical waveguide, the optical modulator including a semiconductor device, an optical property of the waveguide depending on a concentration of charge carriers in a portion of a semiconductor device, the integrated circuit comprising: a modulator driver circuit configured to control encoding of a first symbol in the optical signal by injecting charge carriers into a portion of the semiconductor device at a first rate, and to control encoding of a second symbol in the optical signal by injecting charge carriers into the portion of the semiconductor device at a second rate, wherein the first rate is greater than the second rate.

(B2) The integrated circuit of (B1) wherein the modulator driver circuit is configured to inject charge carriers at the first rate by applying a forward bias voltage to the semiconductor device while providing a first signal to the semiconductor device, the forward bias voltage exceeding a threshold voltage of the semiconductor device.

(B3) The integrated circuit of any of (B1) to (B2), wherein the modulator driver circuit is configured to inject charge carriers at the second rate by applying a forward bias voltage to the semiconductor device, the forward bias voltage not exceeding a threshold voltage of the semiconductor device.

(B4) The integrated circuit of any of (B1) to (B3), wherein the modulator driver circuit is further configured to encode the first symbol by pre-emphasizing injection of charge carrier injection, pre-emphasizing injection of charge carriers comprises injecting charge carriers, at a third rate, into the portion of the semiconductor device, prior to injecting charge carriers at the first rate, and the third rate is greater than the first rate.

(B5) The integrated circuit of (B4), wherein the modulator driver circuit is configured to inject charge carriers at the third rate by applying a forward bias voltage to the semiconductor device while providing a second signal to the semiconductor device, the forward bias voltage exceeding a threshold voltage of the semiconductor device, wherein a drive strength of the second signal exceeds a drive strength of the first signal.

(B6) The integrated circuit of any of (B1) to (B5), wherein the modulator driver circuit is further configured to encode the second symbol by depleting charge carriers from the portion of the semiconductor device prior to injecting the charge carriers at the second rate.

(B7) The integrated circuit of (B6), wherein the driver modulator circuit is configured to deplete charge carriers from the portion of the semiconductor device by applying a reverse bias voltage to the semiconductor device.

(B8) The integrated circuit of any of (B1) to (B7), wherein: the semiconductor device is a PIN diode, and the portion of the semiconductor device is an intrinsic region of the PIN diode.

(B9) The integrated circuit of any of (B1) to (B8), further comprising the optical modulator and the optical waveguide.

(B10) The integrated circuit of any of (B1) to (B9), wherein the integrated circuit is a monolithic integrated circuit fabricated in a standard CMOS process.

(C1) A method of fabricating an integrated circuit in a manufacturing process, comprising: in a first layer of the manufacturing process, fabricating a body of a transistor of a modulator driver circuit configured to control an optical modulator, the transistor being configured to modulate a resistance between an optical modulator and a supply; in a second layer of the manufacturing process, fabricating a gate of the transistors of the modulator driver circuit; and fabricating an optical waveguide core in the first layer and/or the second layer of the manufacturing process.

(C2) The method of (C1), further comprising fabricating a diode in the first layer of the manufacturing process, wherein a portion of the optical waveguide core is embedded in a portion of the diode.

(C3) The method of any of (C1) to (C2), wherein the manufacturing process is a standard CMOS process.

(C4) The method of any of (C1) to (C3), wherein the manufacturing process is a 65 nm process, a 45 nm process, a 32 nm process, a 28 nm process, a 22 nm process, a 14 nm process, an 11 nm process, a 7 nm process, or a 5 nm process.

(C5) The method of any of (C1) to (C3), wherein the manufacturing process is a sub-90 nm process.

(D1) An integrated circuit for controlling an optical modulator, the optical modulator configured to encode data in an optical signal carried by an optical waveguide, the optical modulator including a semiconductor device, an optical property of the waveguide depending on a concentration of charge carriers in a portion of a semiconductor device, the integrated circuit comprising: a modulator driver circuit including: a data terminal for receiving data to be optically encoded; a supply terminal for coupling to one or more supplies; a drive terminal for coupling to the optical modulator; a resistive circuit coupled between the supply terminal and the drive terminal, the resistive circuit including a plurality of portions; and a control circuit coupled between the data terminal and the resistive circuit, the control circuit being configured to modulate a resistance of the resistive circuit by selectively coupling one or more of the plurality of portions of the resistive circuit to the drive terminal based on the data to be optically encoded.

(D2) The integrated circuit of (D1), wherein: a first portion of the control circuit is coupled to a first of the plurality of portions of the resistive circuit, and a second of the plurality of portions of the control circuit is coupled to a second of the plurality of portions of the resistive circuit; and the first portion of the resistive circuit is configured to provide a voltage of a first polarity across the drive terminal, and the second portion of the resistive circuit is configured to provide a voltage of a second polarity across the drive terminal, the first and second polarities being opposite polarities.

(D3) The integrated circuit of (D2), wherein: the first portion of the resistive circuit includes: two of more sub-circuits coupled in parallel, and a configuration terminal for receiving a configuration signal; and the modulator driver circuit is configured to modulate a resistance of the first portion of the resistive circuit by selectively coupling one or more of the two or more sub-circuits between the drive terminal and a first of the one or more power supplies based on the configuration signal.

(D4) The integrated circuit of any of (D1) to (D3), wherein the control circuit include a differential cascode voltage switch (DCVS) circuit.

(D5) The integrated circuit of any of (D1) to (D4), wherein the control circuit includes one or more pulse generator circuits configured to generate pulse signals in response to the data to be optically encoded.

(D6) The integrated circuit of any of (D1) to (D5), wherein the one or more supplies include an input/output power supply and a core logic power supply.

(D7) The integrated circuit of any of (D1) to (D6), further comprising the optical modulator and the optical waveguide.

(D8) The integrated circuit of (D7), wherein: the semiconductor device is a PIN diode, and the portion of the semiconductor device is an intrinsic region of the PIN diode.

(D9) The integrated circuit of any of (D1) to (D8), wherein the integrated circuit is a monolithic integrated circuit fabricated in a standard CMOS process.

What is claimed is:

1. A method of fabricating an integrated circuit in a manufacturing process, comprising:
   in a silicon layer of the manufacturing process, fabricating a body of a transistor of a modulator driver circuit configured to control an optical modulator, the transistor being configured to modulate a resistance between an optical modulator and a supply, wherein the silicon layer is a first layer of the manufacturing process;
   in a second layer of the manufacturing process, fabricating a gate of the transistor of the modulator driver circuit;
   fabricating an optical waveguide core in the silicon layer of the manufacturing process; and
   fabricating a diode in the silicon layer of the manufacturing process, wherein a portion of the optical waveguide core is embedded in a portion of the diode.

2. The method of claim 1, wherein the manufacturing process is a bulk silicon process.

3. The method of claim 1, wherein the manufacturing process is a 65 nm process, a 45 nm process, a 32 nm process, or a 28 nm process.

4. The method of claim 1, wherein the manufacturing process is a silicon-on-insulator (SOI) process.

5. The method of claim 1, wherein the silicon layer is doped.

6. The method of claim 1, wherein the second layer of the manufacturing process comprises a poly-silicon layer.

7. The method of claim 1, further comprising capping the second layer of the manufacturing process with a layer of nickel silicide.

8. The method of claim 1, wherein the second layer of the manufacturing process has a thickness that is between 65 nm and 200 nm.

9. The method of claim 1, further comprising fabricating an optical resonator in the silicon layer of the manufacturing process.

10. The method of claim 1, wherein fabricating the optical waveguide core comprises fabricating at least one waveguide core selected from the group consisting of a rib waveguide core and a strip waveguide core.

11. The method of claim 1, wherein fabricating the diode comprises fabricating at least one diode selected from the group consisting of a PIN diode and a PN junction diode.

* * * * *